(12) United States Patent
Toichi

(10) Patent No.: US 9,748,954 B2
(45) Date of Patent: Aug. 29, 2017

(54) CALCULATION DEVICE AND CALCULATION METHOD

(71) Applicant: FUJITSU LIMITED, Kawasaki-shi, Kanagawa (JP)

(72) Inventor: Masahiko Toichi, Urayasu (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/254,413

(22) Filed: Sep. 1, 2016

(65) Prior Publication Data
US 2017/0117892 A1    Apr. 27, 2017

(30) Foreign Application Priority Data
Oct. 22, 2015  (JP) .................................. 2015-207977

(51) Int. Cl.
*H03K 19/00* (2006.01)
*H03K 19/177* (2006.01)

(52) U.S. Cl.
CPC ..... *H03K 19/0008* (2013.01); *H03K 19/1776* (2013.01)

(58) Field of Classification Search
CPC ....................... H03K 19/0008; H03K 19/1776
USPC ................. 326/37–41, 47; 716/116
See application file for complete search history.

(56) References Cited

U.S. PATENT DOCUMENTS

| | | | | |
|---|---|---|---|---|
| 7,112,997 B1 * | 9/2006 | Liang | .................. | G06F 17/5054 257/E21.703 |
| 7,129,745 B2 * | 10/2006 | Lewis | .................. | G06F 17/5054 326/38 |
| 8,198,914 B2 * | 6/2012 | Lee | .................. | H03K 19/17784 326/38 |
| 8,461,869 B1 * | 6/2013 | Rahim | .................. | H03K 19/17784 326/32 |
| 9,577,620 B2 * | 2/2017 | Chang | .................. | H03K 5/05 |

(Continued)

FOREIGN PATENT DOCUMENTS

| | | |
|---|---|---|
| JP | 2010-103362 | 5/2010 |
| JP | 2013-98823 | 5/2013 |
| JP | 2014-52918 | 3/2014 |

OTHER PUBLICATIONS

Andrew Putnam—Microsoft, "Large-Scale Reconfigurable Computing in a Microsoft Datacenter"; 2014, 36 pages, [online], retrieved from the Internet <URL: http://www.ee.washington.edu/faculty/hauck/publications/CatapultHotChips.pdf>.

*Primary Examiner* — Dylan White
(74) *Attorney, Agent, or Firm* — Fujitsu Patent Center

(57) ABSTRACT

A calculation device includes a programmable logic device including a plurality of circuit arrangement areas each to which power supply voltage allowed to be independently controlled is supplied and a calculation circuit coupled to the programmable logic device. The calculation circuit arranges a main circuit that executes specific processing in a first circuit arrangement area included in the plurality of circuit arrangement areas, acquires a second circuit arrangement area in which a sub circuit that executes the specific processing is allowed to be arranged, included in the plurality of circuit arrangement areas and in which the main circuit is not arranged, arranges the sub circuit in the second circuit arrangement area, and causes one of the main circuit and the sub circuit to execute the specific processing.

12 Claims, 24 Drawing Sheets

(56) References Cited

U.S. PATENT DOCUMENTS

2010/0257335 A1* 10/2010 Hanai ................. G06F 15/7867
712/15

* cited by examiner

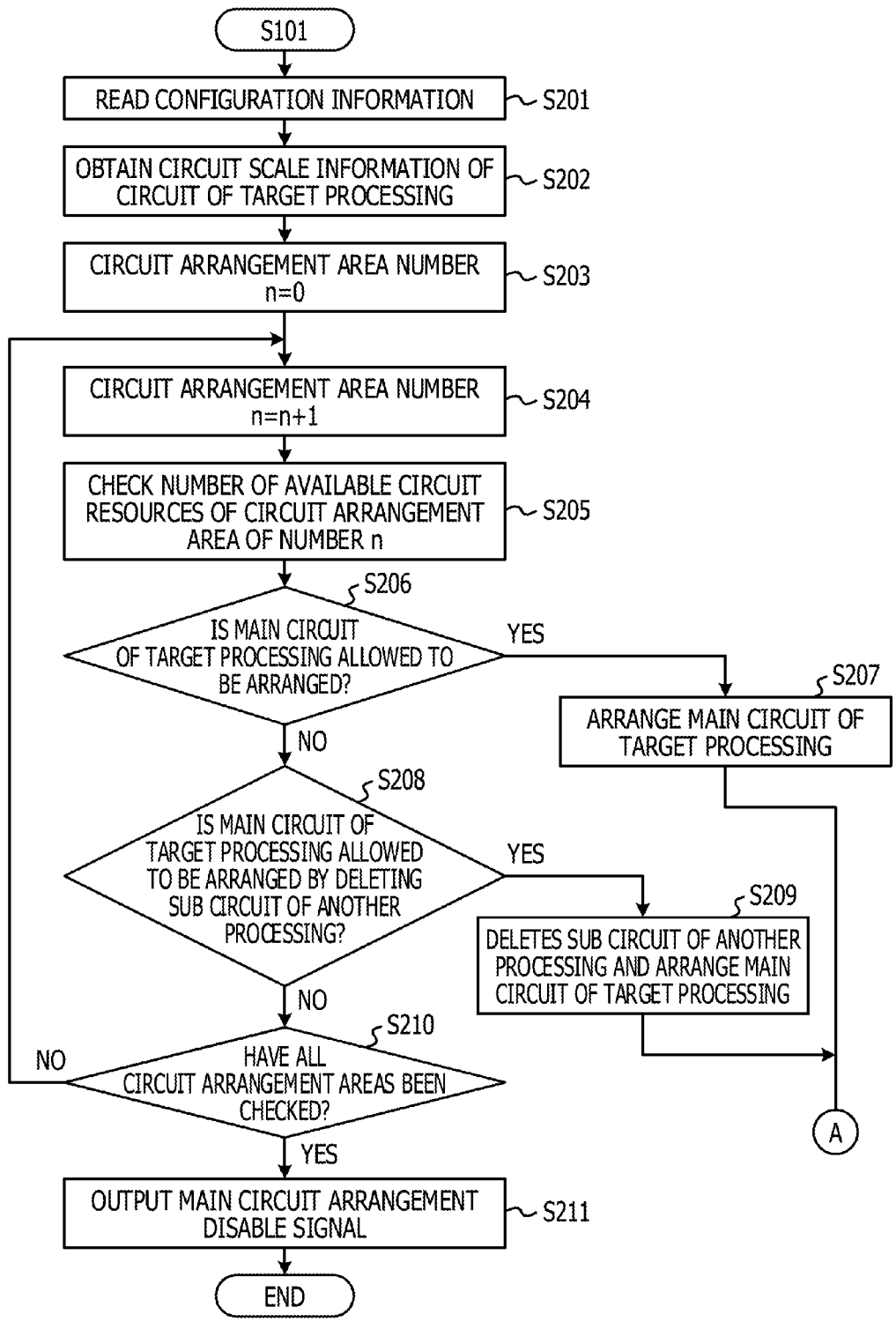

FIG. 12A

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 1 | PR00 | 1 | ID21 | 1 | 1 |
|  | 1 | PR01 | 1 | ID21 | 1 | 1 |
|  | 1 | PR02 | 1 | ID22 | 1 | 1 |
|  | 1 | PR03 | 1 | ID22 | 1 | 1 |
| PD01 | 0 | PR10 | 0 |  |  |  |
|  | 0 | PR11 | 0 |  |  |  |
|  | 0 | PR12 | 0 |  |  |  |
|  | 0 | PR13 | 0 |  |  |  |
|  | 0 | PR14 | 1 | ID21 | 0 | 0 |
|  | 0 | PR15 | 1 | ID21 | 0 | 0 |
|  | 0 | PR16 | 1 | ID22 | 0 | 0 |
|  | 0 | PR17 | 1 | ID22 | 0 | 0 |
| PD02 | 0 | PR20 | 0 |  |  |  |
|  | 0 | PR21 | 0 |  |  |  |
|  | 0 | PR22 | 0 |  |  |  |
|  | 0 | PR23 | 0 |  |  |  |
|  | 0 | PR24 | 1 | ID21 | 0 | 0 |
|  | 0 | PR25 | 1 | ID21 | 0 | 0 |
|  | 0 | PR26 | 1 | ID22 | 0 | 0 |
|  | 0 | PR27 | 1 | ID22 | 0 | 0 |
|  | 0 | PR28 | 0 |  |  |  |
|  | 0 | PR29 | 0 |  |  |  |
|  | 0 | PR2A | 0 |  |  |  |
|  | 0 | PR2B | 0 |  |  |  |

FIG. 12B

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 0 | PR00 | 1 | ID21 | 1 | 1 |
|      | 0 | PR01 | 1 | ID21 | 1 | 1 |
|      | 0 | PR02 | 1 | ID22 | 1 | 1 |
|      | 0 | PR03 | 1 | ID22 | 1 | 1 |
| PD01 | 1 | PR10 | 1 | ID35 | 1 | 0 |
|      | 1 | PR11 | 1 | ID35 | 1 | 0 |
|      | 1 | PR12 | 1 | ID35 | 1 | 0 |
|      | 1 | PR13 | 1 | ID35 | 1 | 0 |
|      | 1 | PR14 | 1 | ID21 | 0 | 0 |
|      | 1 | PR15 | 1 | ID21 | 0 | 0 |
|      | 1 | PR16 | 1 | ID22 | 0 | 0 |
|      | 1 | PR17 | 1 | ID22 | 0 | 0 |
| PD02 | 0 | PR20 | 1 | ID35 | 0 | 0 |
|      | 0 | PR21 | 1 | ID35 | 0 | 0 |
|      | 0 | PR22 | 1 | ID35 | 0 | 0 |
|      | 0 | PR23 | 1 | ID35 | 0 | 0 |
|      | 0 | PR24 | 1 | ID21 | 0 | 0 |
|      | 0 | PR25 | 1 | ID21 | 0 | 0 |
|      | 0 | PR26 | 1 | ID22 | 0 | 0 |
|      | 0 | PR27 | 1 | ID22 | 0 | 0 |
|      | 0 | PR28 | 0 |      |   |   |
|      | 0 | PR29 | 0 |      |   |   |
|      | 0 | PR2A | 0 |      |   |   |
|      | 0 | PR2B | 0 |      |   |   |

FIG. 13A

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 0 | PR00 | 1 | ID21 | 1 | 0 |
| | 0 | PR01 | 1 | ID21 | 1 | 0 |
| | 0 | PR02 | 1 | ID22 | 1 | 0 |
| | 0 | PR03 | 1 | ID22 | 1 | 0 |
| PD01 | 1 | PR10 | 1 | ID35 | 1 | 1 |
| | 1 | PR11 | 1 | ID35 | 1 | 1 |
| | 1 | PR12 | 1 | ID35 | 1 | 1 |
| | 1 | PR13 | 1 | ID35 | 1 | 1 |
| | 1 | PR14 | 1 | ID21 | 0 | 1 |
| | 1 | PR15 | 1 | ID21 | 0 | 1 |
| | 1 | PR16 | 1 | ID22 | 0 | 1 |
| | 1 | PR17 | 1 | ID22 | 0 | 1 |
| PD02 | 0 | PR20 | 1 | ID35 | 0 | 0 |
| | 0 | PR21 | 1 | ID35 | 0 | 0 |
| | 0 | PR22 | 1 | ID35 | 0 | 0 |
| | 0 | PR23 | 1 | ID35 | 0 | 0 |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

FIG. 13B

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 0 | PR00 | 1 | ID21 | 1 | 0 |
| | 0 | PR01 | 1 | ID21 | 1 | 0 |
| | 0 | PR02 | 1 | ID22 | 1 | 0 |
| | 0 | PR03 | 1 | ID22 | 1 | 0 |
| PD01 | 0 | PR10 | 1 | ID35 | 1 | 1 |
| | 0 | PR11 | 1 | ID35 | 1 | 1 |
| | 0 | PR12 | 1 | ID35 | 1 | 1 |
| | 0 | PR13 | 1 | ID35 | 1 | 1 |
| | 0 | PR14 | 1 | ID21 | 0 | 1 |
| | 0 | PR15 | 1 | ID21 | 0 | 1 |
| | 0 | PR16 | 1 | ID22 | 0 | 0 |
| | 0 | PR17 | 1 | ID22 | 0 | 0 |
| PD02 | 0 | PR20 | 1 | ID35 | 0 | 0 |
| | 0 | PR21 | 1 | ID35 | 0 | 0 |
| | 0 | PR22 | 1 | ID35 | 0 | 0 |
| | 0 | PR23 | 1 | ID35 | 0 | 0 |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

FIG. 14A

| CIRCUIT ARRANGEMENT AREA | ON/OFF | CIRCUIT RESOURCE | ARRANGEMENT | CIRCUIT ID | MAIN/ SUB | IN OPERATION |
|---|---|---|---|---|---|---|
| PD00 | 0 | PR00 | 1 | ID21 | 1 | 0 |
| | 0 | PR01 | 1 | ID21 | 1 | 0 |
| | 0 | PR02 | 1 | ID22 | 1 | 0 |
| | 0 | PR03 | 1 | ID22 | 1 | 0 |
| PD01 | 1 | PR10 | 1 | ID35 | 1 | 0 |
| | 1 | PR11 | 1 | ID35 | 1 | 0 |
| | 1 | PR12 | 1 | ID35 | 1 | 0 |
| | 1 | PR13 | 1 | ID35 | 1 | 0 |
| | 1 | PR14 | 1 | ID21 | 0 | 1 |
| | 1 | PR15 | 1 | ID21 | 0 | 1 |
| | 1 | PR16 | 1 | ID22 | 0 | 0 |
| | 1 | PR17 | 1 | ID22 | 0 | 0 |
| PD02 | 0 | PR20 | 1 | ID35 | 0 | 0 |
| | 0 | PR21 | 1 | ID35 | 0 | 0 |
| | 0 | PR22 | 1 | ID35 | 0 | 0 |
| | 0 | PR23 | 1 | ID35 | 0 | 0 |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

FIG. 14B

| CIRCUIT ARRANGEMENT AREA | ON/OFF | CIRCUIT RESOURCE | ARRANGEMENT | CIRCUIT ID | MAIN/ SUB | IN OPERATION |
|---|---|---|---|---|---|---|
| PD00 | 0 | PR00 | 1 | ID21 | 1 | 0 |
| | 0 | PR01 | 1 | ID21 | 1 | 0 |
| | 0 | PR02 | 1 | ID22 | 1 | 0 |
| | 0 | PR03 | 1 | ID22 | 1 | 0 |
| PD01 | 0 | PR10 | 1 | ID35 | 1 | 0 |
| | 0 | PR11 | 1 | ID35 | 1 | 0 |
| | 0 | PR12 | 1 | ID35 | 1 | 0 |
| | 0 | PR13 | 1 | ID35 | 1 | 0 |
| | 0 | PR14 | 1 | ID21 | 0 | 1 |
| | 0 | PR15 | 1 | ID21 | 0 | 1 |
| | 0 | PR16 | 1 | ID22 | 0 | 0 |
| | 0 | PR17 | 1 | ID22 | 0 | 0 |
| PD02 | 0 | PR20 | 1 | ID35 | 0 | 0 |
| | 0 | PR21 | 1 | ID35 | 0 | 0 |
| | 0 | PR22 | 1 | ID35 | 0 | 0 |
| | 0 | PR23 | 1 | ID35 | 0 | 0 |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

FIG. 15A

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 1 | PR00 | 1 | ID21 | 1 | 1 |
| | 1 | PR01 | 1 | ID21 | 1 | 1 |
| | 1 | PR02 | 1 | ID22 | 1 | 0 |
| | 1 | PR03 | 1 | ID22 | 1 | 0 |
| PD01 | 0 | PR10 | 1 | ID35 | 1 | 0 |
| | 0 | PR11 | 1 | ID35 | 1 | 0 |
| | 0 | PR12 | 1 | ID35 | 1 | 0 |
| | 0 | PR13 | 1 | ID35 | 1 | 0 |
| | 0 | PR14 | 1 | ID21 | 0 | 0 |
| | 0 | PR15 | 1 | ID21 | 0 | 0 |
| | 0 | PR16 | 1 | ID22 | 0 | 0 |
| | 0 | PR17 | 1 | ID22 | 0 | 0 |
| PD02 | 0 | PR20 | 1 | ID35 | 0 | 0 |
| | 0 | PR21 | 1 | ID35 | 0 | 0 |
| | 0 | PR22 | 1 | ID35 | 0 | 0 |
| | 0 | PR23 | 1 | ID35 | 0 | 0 |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

FIG. 15B

| CIRCUIT ARRANGEMENT AREA | ON/OFF | CIRCUIT RESOURCE | ARRANGEMENT | CIRCUIT ID | MAIN/SUB | IN OPERATION |
|---|---|---|---|---|---|---|
| PD00 | 1 | PR00 | 1 | ID21 | 1 | 1 |
| | 1 | PR01 | 1 | ID21 | 1 | 1 |
| | 1 | PR02 | 1 | ID22 | 1 | 0 |
| | 1 | PR03 | 1 | ID22 | 1 | 0 |
| PD01 | 0 | PR10 | 0 | | | |
| | 0 | PR11 | 0 | | | |
| | 0 | PR12 | 0 | | | |
| | 0 | PR13 | 0 | | | |
| | 0 | PR14 | 1 | ID21 | 0 | 0 |
| | 0 | PR15 | 1 | ID21 | 0 | 0 |
| | 0 | PR16 | 1 | ID22 | 0 | 0 |
| | 0 | PR17 | 1 | ID22 | 0 | 0 |
| PD02 | 0 | PR20 | 0 | | | |
| | 0 | PR21 | 0 | | | |
| | 0 | PR22 | 0 | | | |
| | 0 | PR23 | 0 | | | |
| | 0 | PR24 | 1 | ID21 | 0 | 0 |
| | 0 | PR25 | 1 | ID21 | 0 | 0 |
| | 0 | PR26 | 1 | ID22 | 0 | 0 |
| | 0 | PR27 | 1 | ID22 | 0 | 0 |
| | 0 | PR28 | 0 | | | |
| | 0 | PR29 | 0 | | | |
| | 0 | PR2A | 0 | | | |
| | 0 | PR2B | 0 | | | |

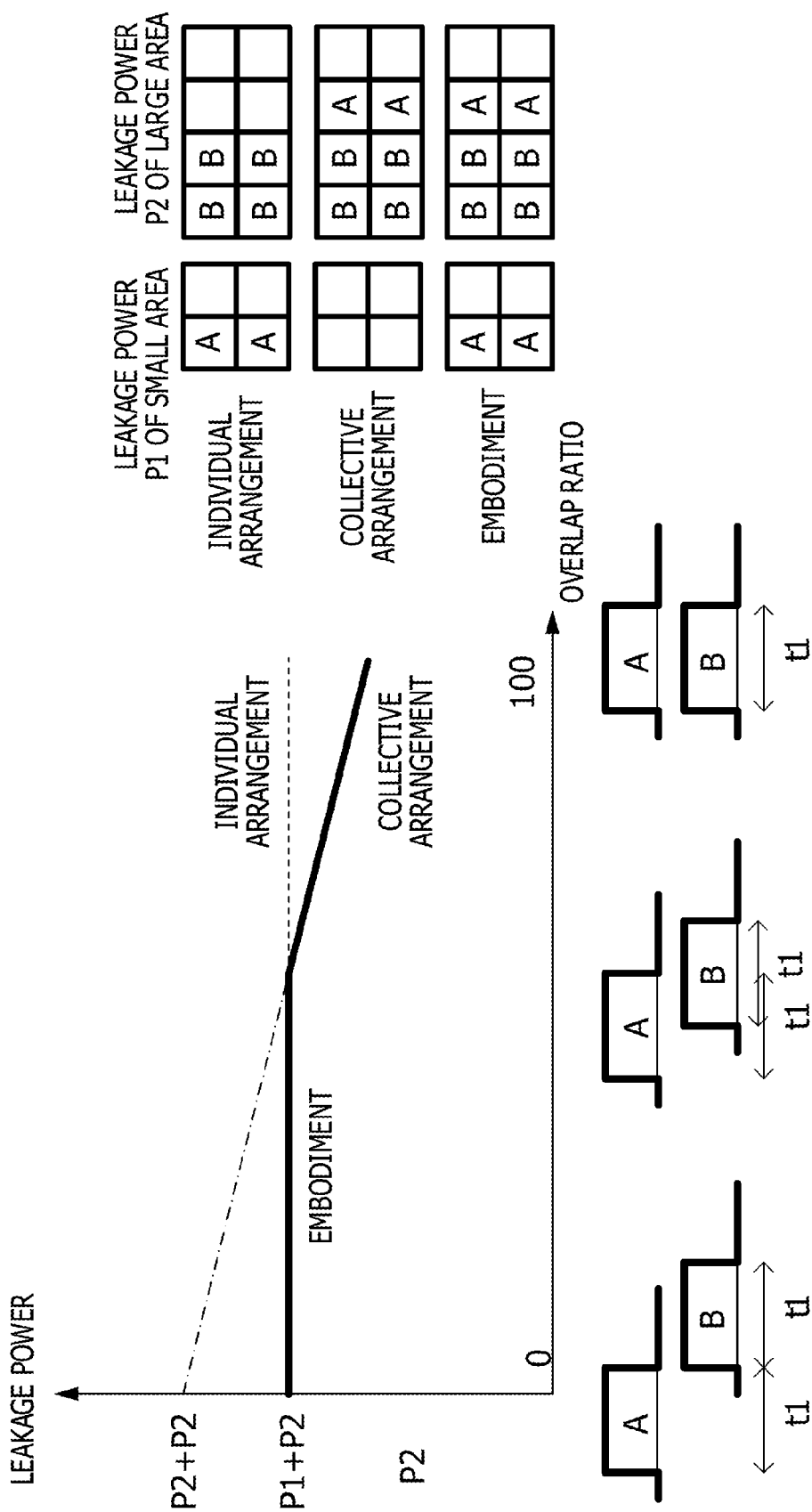

CALCULATION DEVICE AND CALCULATION METHOD

CROSS-REFERENCE TO RELATED APPLICATION

This application is based upon and claims the benefit of priority of the prior Japanese Patent Application No. 2015-207977, filed on Oct. 22, 2015, the entire contents of which are incorporated herein by reference.

FIELD

The embodiments discussed herein are related to a calculation device and a calculation method.

BACKGROUND

A programmable logic device (PLD) such as a field-programmable gate array (FPGA) is used.

Related arts are discussed in Japanese Laid-open Patent Publication No. 2013-98823, Japanese Laid-open Patent Publication No. 2010-103362, Japanese Laid-open Patent Publication No. 2014-52918, and "Large-Scale Reconfigurable Computing in a Microsoft Datacenter" http://www.ee.washington.edu/faculty/hauck/publications/CatapultHotChips.pdf.

SUMMARY

According to an aspect of the invention, a calculation device includes: a programmable logic device including a plurality of circuit arrangement areas each to which power supply voltage allowed to be independently controlled is supplied; and a calculation circuit coupled to the programmable logic device, wherein the calculation circuit: arranges a main circuit that executes specific processing in a first circuit arrangement area included in the plurality of circuit arrangement areas; acquires a second circuit arrangement area in which a sub circuit that executes the specific processing is allowed to be arranged, included in the plurality of circuit arrangement areas and in which the main circuit is not arranged; arranges the sub circuit in the second circuit arrangement area; and causes one of the main circuit and the sub circuit to execute the specific processing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 4A and 4B are diagrams illustrating an example of processing of S101;

FIGS. 12A and 12B are diagrams illustrating examples of a management table in a state in which the calculation processing is executed;

FIGS. 13A and 13B are diagrams illustrating examples of the management table in the state in which the calculation processing is executed;

FIGS. 14A and 14B are diagrams illustrating examples of the management table in the state in which the calculation processing is executed;

FIGS. 15A and 15B are diagrams illustrating examples of the management table in the state in which the calculation processing is executed;

FIG. 17 is a diagram illustrating an example of comparison of pieces of leakage current.

DESCRIPTION OF EMBODIMENTS

For example, when a central processing unit (CPU) and an accelerator including a programmable logic device (PLD) such as an FPGA cooperate, the processing speed is improved.

For example, power supply voltage supplied to the PLD is changed by a program. For example, a calculation device includes a plurality of calculation elements each of which belongs to any one of a plurality of power control areas and a storage unit that stores correspondence information representing a correspondence relationship between the plurality of calculation elements and the plurality of power control areas. The calculation device further includes a scheduler that assigns tasks to the plurality of calculation elements and generates a schedule and a supply unit that supplies power supply voltage to the power control area based on the generated schedule. For example, the semiconductor device includes a power supply voltage generation unit that generates a plurality of pieces of power supply voltage and a switch unit that couples any one of the plurality of pieces of power supply voltage that have been generated by the power supply voltage generation unit to the PLD selectively.

In the PLD, the circuit scale of an arranged circuit is different from the circuit scale a circuit of which is allowed to be arranged in the PLD, so that there exists a free area in which a circuit is not arranged, in a part of the arrangement area. In the free area of the PLD, a circuit is not arranged, so that dynamic power consumption does not occur, but static power consumption caused by leakage current or the like may occur.

The calculation device includes a calculation circuit and an FPGA including a plurality of circuit arrangement areas to which pieces of power supply voltage allowed to be separately controlled are respectively supplied. In the calculation circuit, a main circuit and a sub circuit that execute substantially the same processing are provided in circuit arrangement areas to which pieces of power supply voltage allowed to be separately controlled are respectively supplied. Therefore, the number of circuit arrangement areas to each of which power supply voltage is supplied is reduced, and static power consumption caused by leakage current may be reduced.

Figure 1:
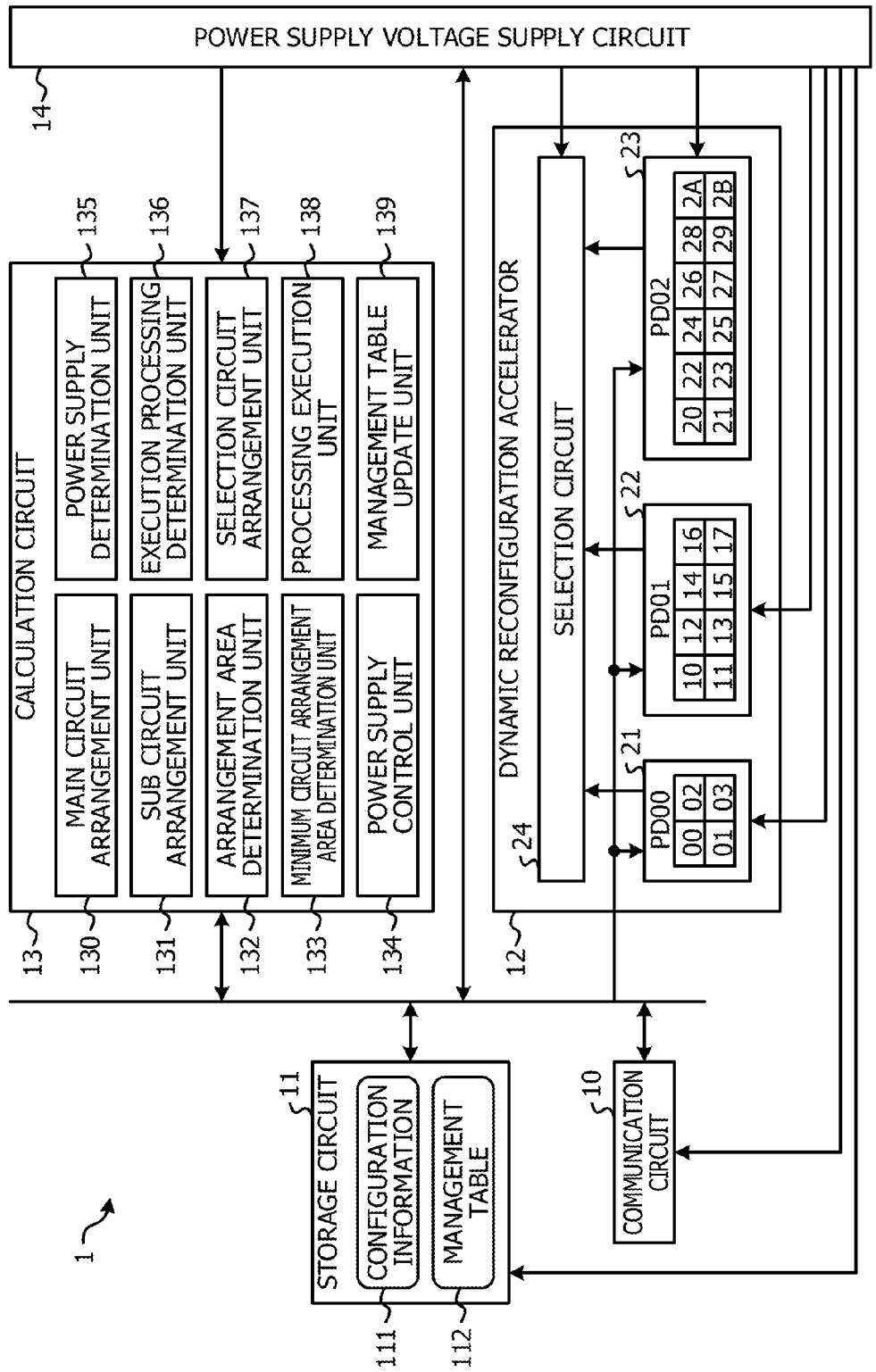
FIG. 1 is a diagram illustrating an example of a calculation device.

FIG. 1 is a diagram illustrating an example of a calculation device.

A calculation device 1 includes a communication circuit 10, a storage circuit 11, a dynamic reconfiguration accelerator 12, a calculation circuit 13, and a power supply voltage supply circuit 14.

For example, the communication circuit 10 outputs information such as a command or the like that has been transmitted from an upper-level calculation device, to the calculation circuit 13. The communication circuit 10 transmits information that has been output from the calculation circuit 13 to the upper-level calculation device.

The storage circuit 11 includes, for example, a semiconductor memory, and stores a driver program, an operating system program, an application program, data, and the like used for calculation processing of the calculation circuit 13. For example, the storage circuit 11 stores, as a driver program, a communication device driver program and the like used to control the communication circuit 10. The storage circuit 11 stores, as an application program, a configuration program used to perform arrangement wiring of a circuit by dynamic reconfiguration into the dynamic reconfiguration accelerator 12 and stores a data processing program which executes various pieces of data processing. The computer program may be installed in the storage circuit 11, for example, from a computer-readable portable recording medium such as a compact disc-read only memory (CD-ROM) and a digital versatile disc-read only memory (DVD-ROM) using a set-up program and the like.

The storage circuit 11 stores configuration information 111 corresponding to a circuit on which dynamic reconfiguration into the dynamic reconfiguration accelerator 12 is performed. The storage circuit 11 stores a management table 112 that stores various pieces of information such as power supply information and operation information of the circuit arranged in the dynamic reconfiguration accelerator 12.

The dynamic reconfiguration accelerator 12 is a PLD including a first circuit arrangement area 21, a second circuit arrangement area 22, a third circuit arrangement area 23, and a selection circuit 24. The dynamic reconfiguration accelerator 12 may include a single PLD, or may include a plurality of PLDs. To the first circuit arrangement area 21, the second circuit arrangement area 22, and the third circuit arrangement area 23, pieces of power supply voltage allowed to be separately controlled are respectively supplied from the power supply voltage supply circuit 14, and the circuit scale of a circuit allowed to be arranged in each of the first circuit arrangement area 21, the second circuit arrangement area 22, and the third circuit arrangement area 23 is different. The first circuit arrangement area 21 includes four circuit resources such as an eleventh circuit resource PR00 to a fourteenth circuit resource PR03. The second circuit arrangement area 22 includes eight circuit resources such as a 21st circuit resource PR10 to a 28th circuit resource PR17. The third circuit arrangement area 23 includes 12 circuit resources such as a 31st circuit resource PR20 to a 3B circuit resource PR2B. To the selection circuit 24, power supply voltage allowed to be controlled separately of the pieces of power supply voltage of the first circuit arrangement area 21, the second circuit arrangement area 22, and the third circuit arrangement area 23 is supplied from the power supply voltage supply circuit 14. The selection circuit 24 outputs information that has been output from any one or all of the first circuit arrangement area 21, the second circuit arrangement area 22, and the third circuit arrangement area 23, to the calculation circuit 13. The first circuit arrangement area 21, the second circuit arrangement area 22, the third circuit arrangement area 23, and the selection circuit 24 are formed by performing dynamic reconfiguration through the calculation circuit 13, based on the configuration information 111 stored in the storage circuit 11.

The calculation circuit 13 includes one or a plurality of processors and the peripheral circuits. The calculation circuit 13 is used to cause various calculation devices to be executed, and for example, may be a central processing unit (CPU). The calculation circuit 13 controls operations of the communication circuit 10, the dynamic reconfiguration accelerator 12, and the like so that various pieces of calculation processing are executed by an appropriate procedure in accordance with programs and the like stored in the storage circuit 11. The calculation circuit 13 executes pieces of processing based on the programs stored in the storage circuit 11 (a driver program, an operating system program, an application program, and the like). The calculation circuit 13 may execute a plurality of programs (an application program and the like) in parallel.

In the calculation circuit 13, a processing speed is improved when a part of the calculation processing is executed by using circuits on which dynamic reconfiguration into the first circuit arrangement area 21, the second circuit arrangement area 22, and the third circuit arrangement area 23 of the dynamic reconfiguration accelerator 12 is performed.

The calculation circuit 13 includes a main circuit arrangement unit 130, a sub circuit arrangement unit 131, an arrangement area determination unit 132, a minimum circuit arrangement area determination unit 133, a power supply control unit 134, a power supply determination unit 135, and an execution processing determination unit 136. The calculation circuit 13 further includes a selection circuit arrangement unit 137, a processing execution unit 138, and a management table update unit 139. These units included in the calculation circuit 13 are function modules implemented by programs executed on the processors included in the calculation circuit 13. These units included in the calculation circuit 13 may be implemented in the calculation device 1 as an independent integrated circuit, a microprocessor, or firmware.

The power supply voltage supply circuit 14 supplies pieces of power supply voltage to the communication circuit 10, the storage circuit 11, the dynamic reconfiguration accelerator 12, and the calculation circuit 13, for example, based on a power supply voltage control command input from the upper-level calculation device or the calculation circuit 13. The power supply voltage supply circuit 14 respectively supplies pieces of power supply voltage allowed to be separately controlled, to the first circuit arrangement area 21, the second circuit arrangement area 22, the third circuit arrangement area 23, and the selection circuit 24 of the dynamic reconfiguration accelerator 12. For example, the power supply voltage supply circuit 14 may supply pieces of power supply voltage to the first circuit arrangement area 21 and the selection circuit 24, and may not supply pieces of power supply voltage to the second circuit arrangement area 22 and the third circuit arrangement area 23. The power supply voltage supply circuit 14 may supply pieces of power supply voltage to the second circuit arrangement area 22 and the selection circuit 24, and may not supply pieces of power supply voltage to the first circuit arrangement area 21 and the third circuit arrangement area 23. The power supply voltage supply circuit 14 may supply power supply voltage to the first circuit arrangement area 21, the second circuit arrangement area 22, the third circuit arrangement area 23, and the selection circuit 24.

Figure 2:
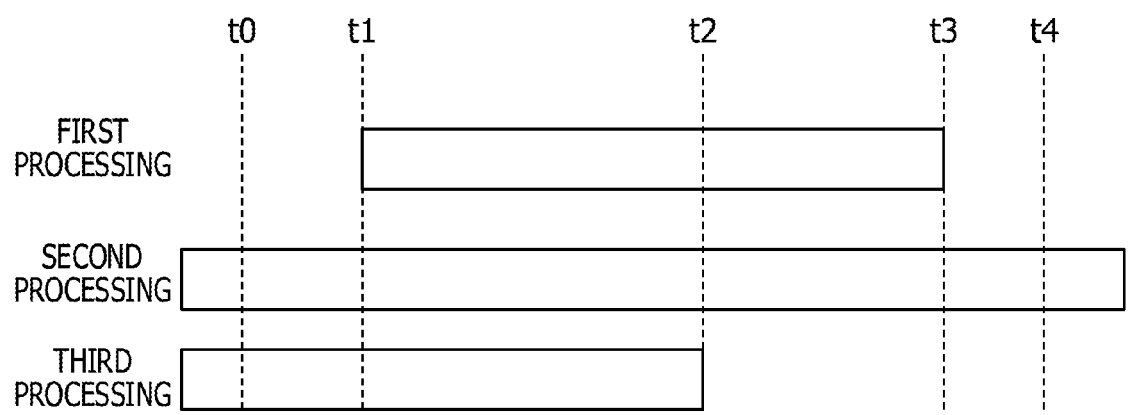
FIG. 2 is a diagram illustrating an example of a timing chart of calculation processing.
Figure 3:
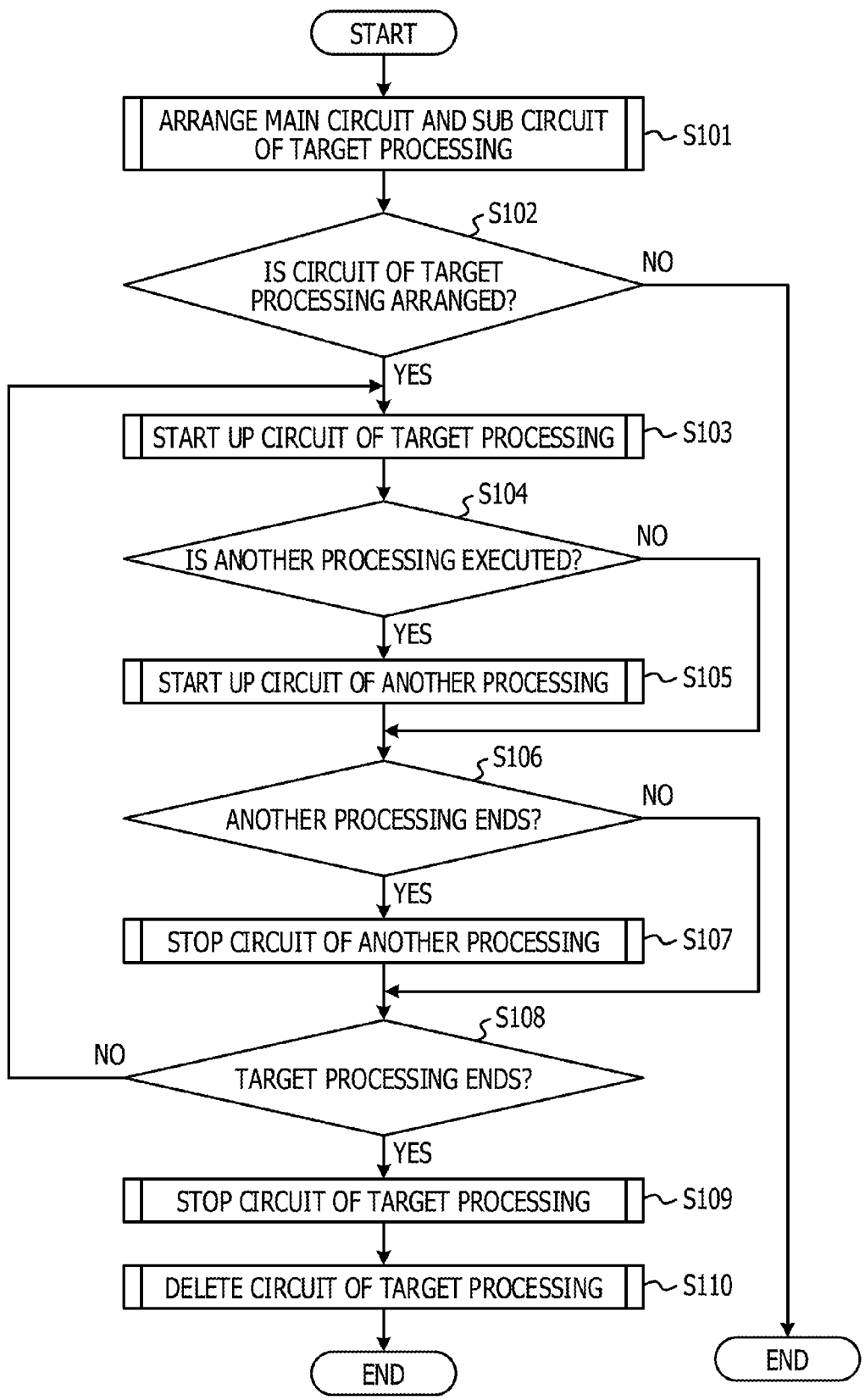
FIG. 3 is a diagram illustrating an example of the calculation processing.
Figure 4B:
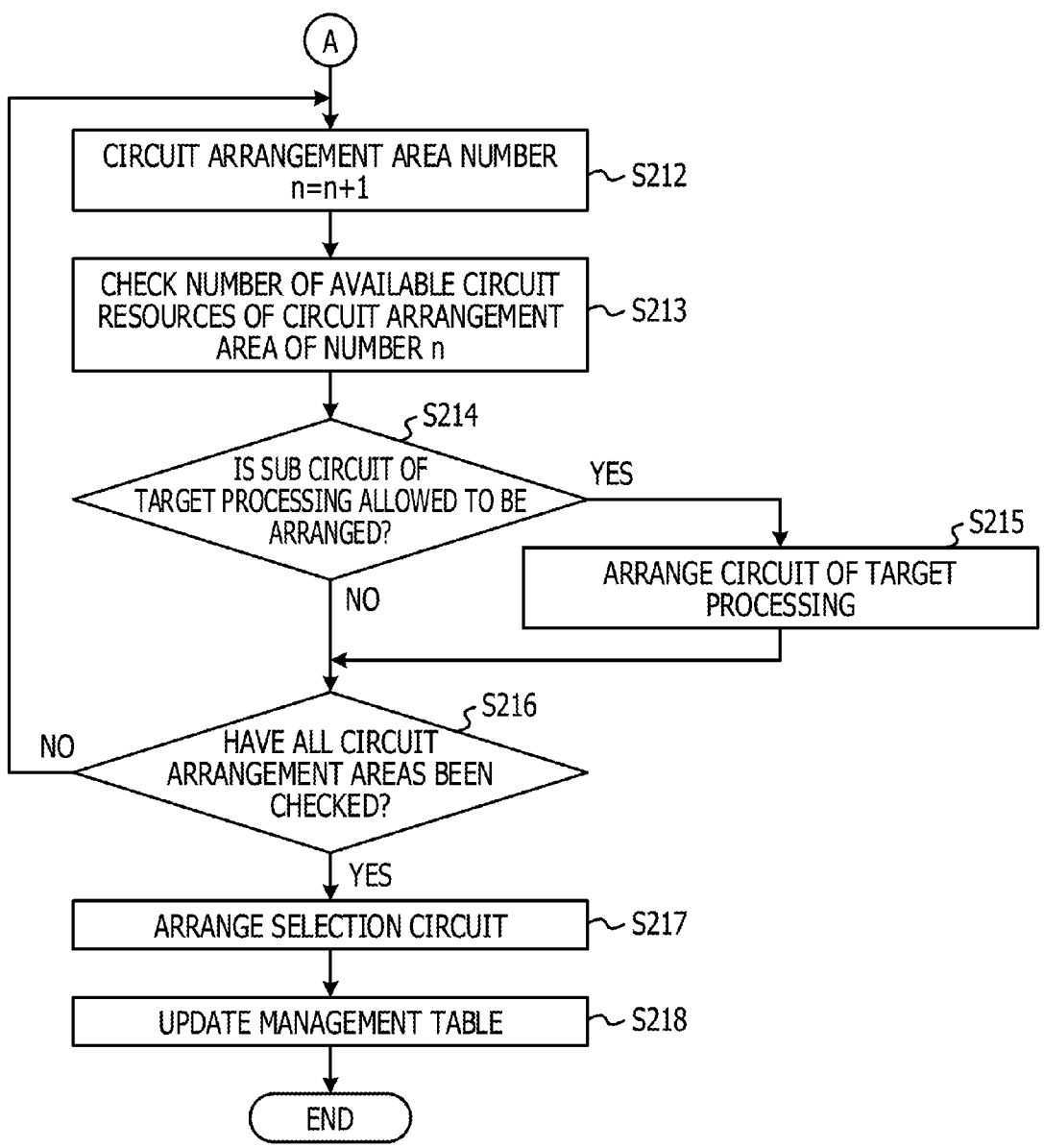
Figure 5:
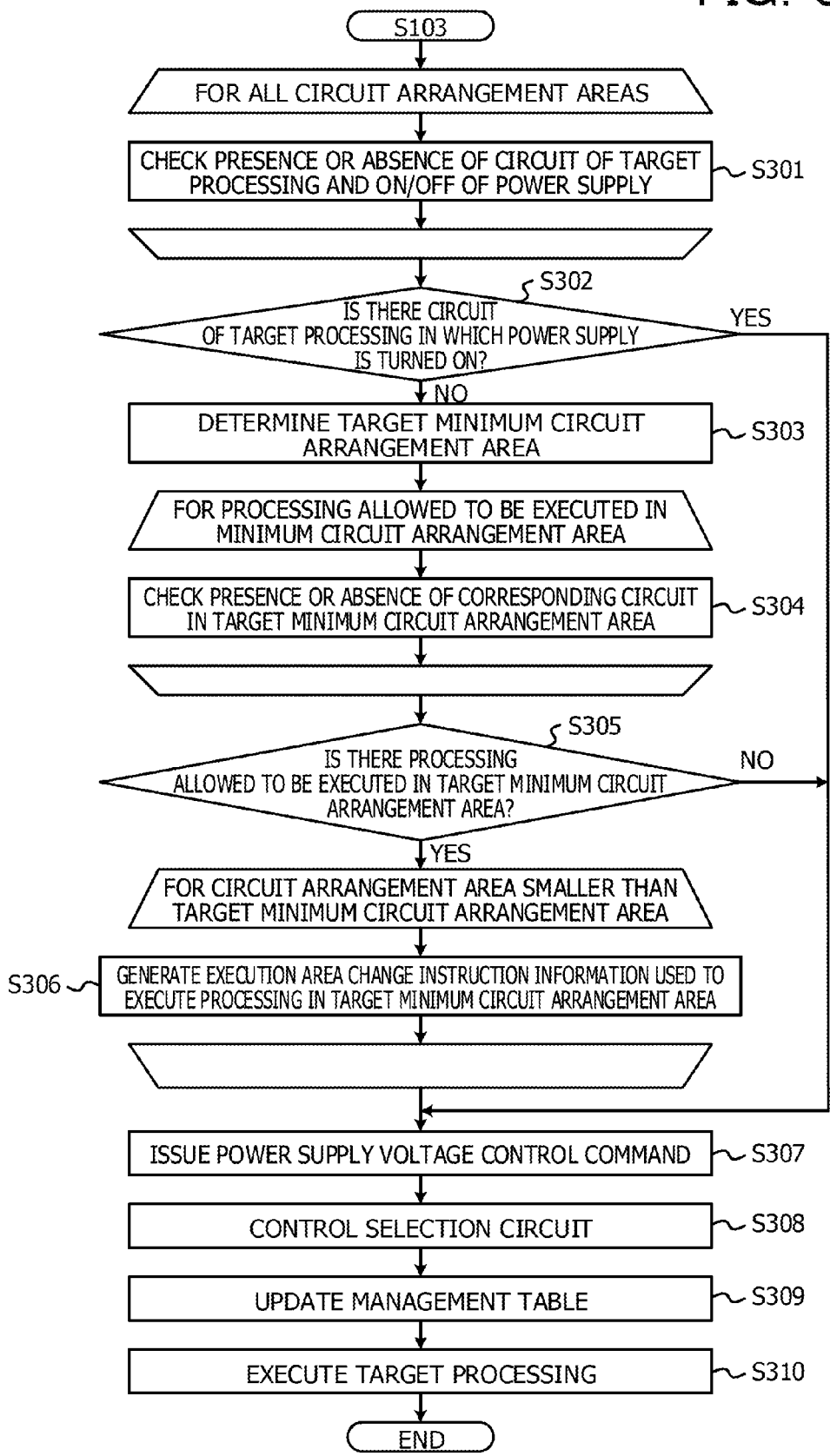
FIG. 5 is a diagram illustrating an example of processing of S103.
Figure 6:
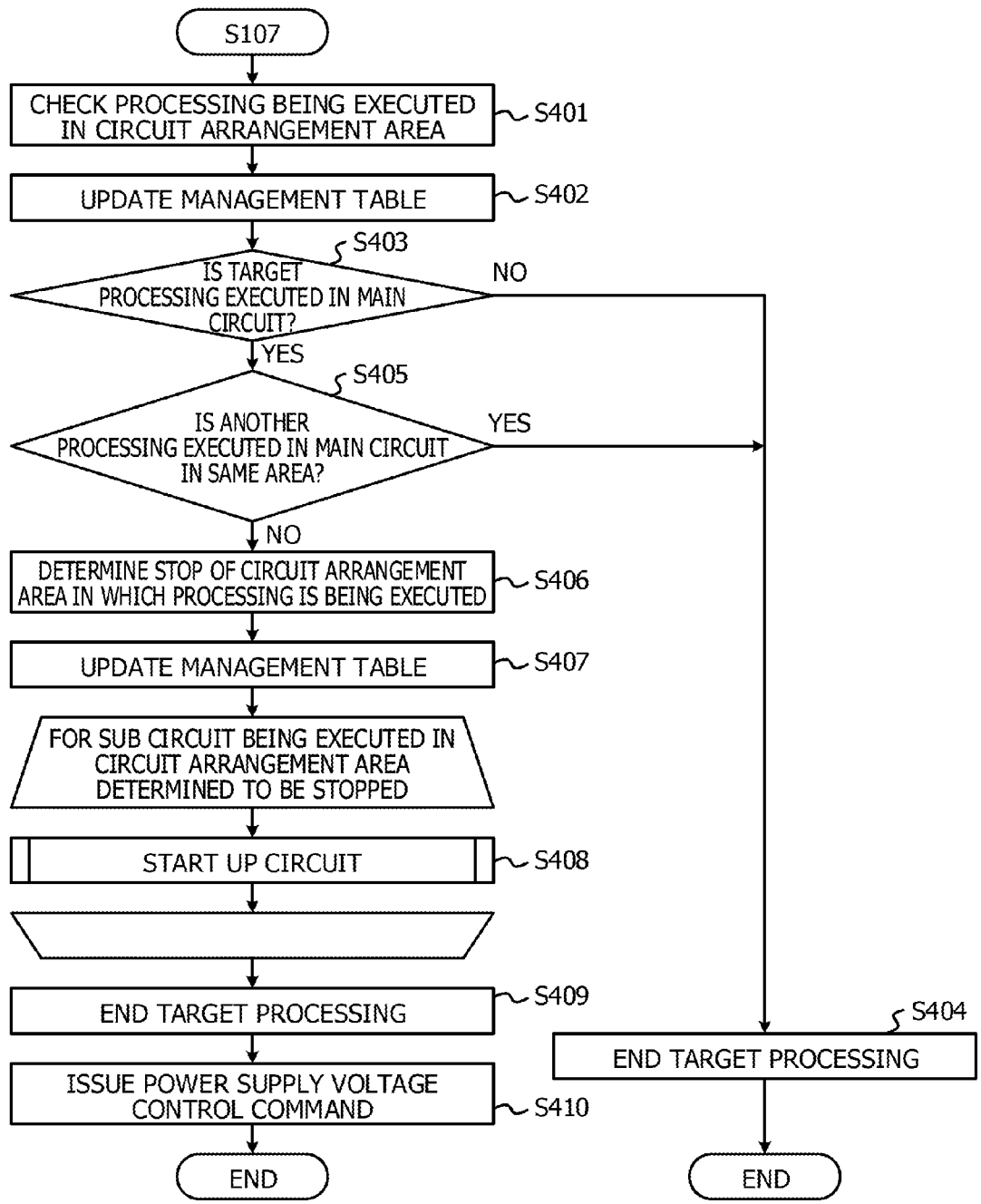
FIG. 6 is a diagram illustrating an example of processing of S107.
Figure 7:
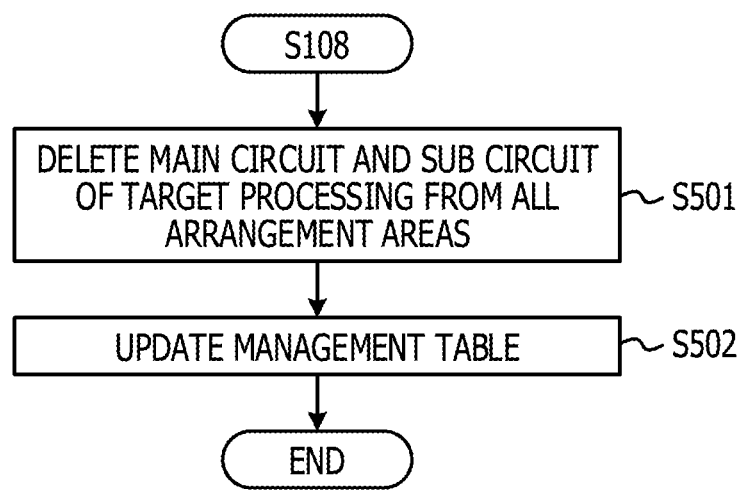
FIG. 7 is a diagram illustrating an example of processing of S108.
Figure 9A:
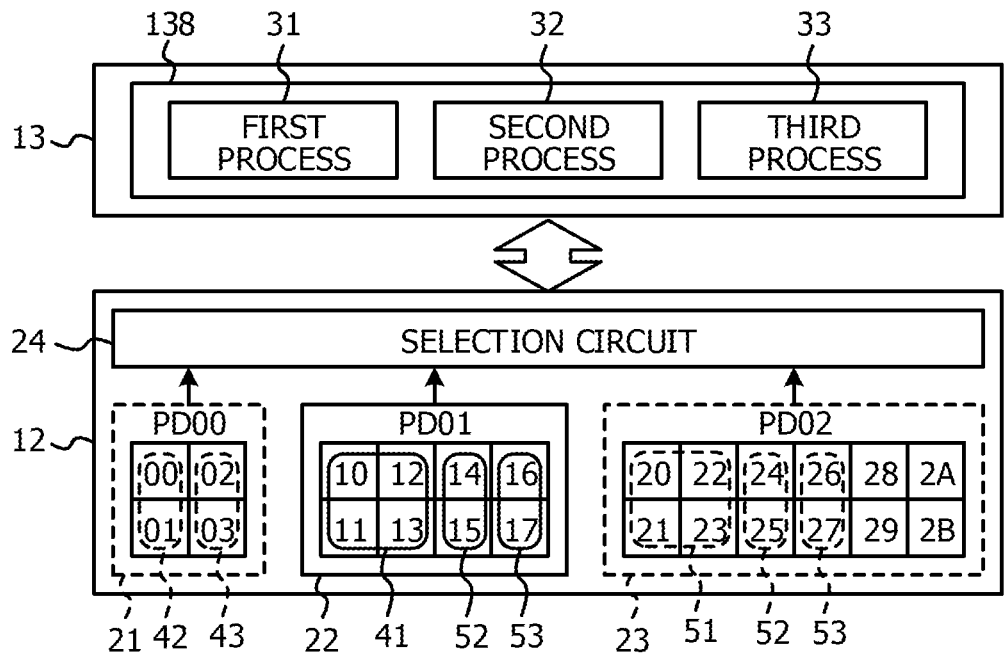
FIGS. 9A and 9B are diagrams illustrating examples of states of the dynamic reconfiguration accelerator and the calculation circuit.
Figure 9B:
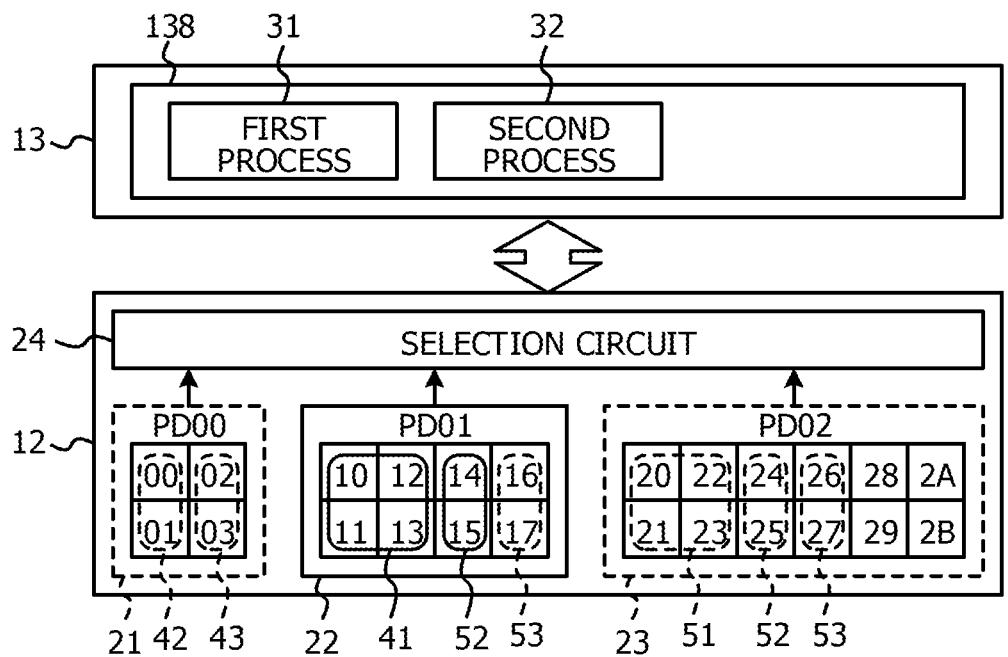
Figure 10A:
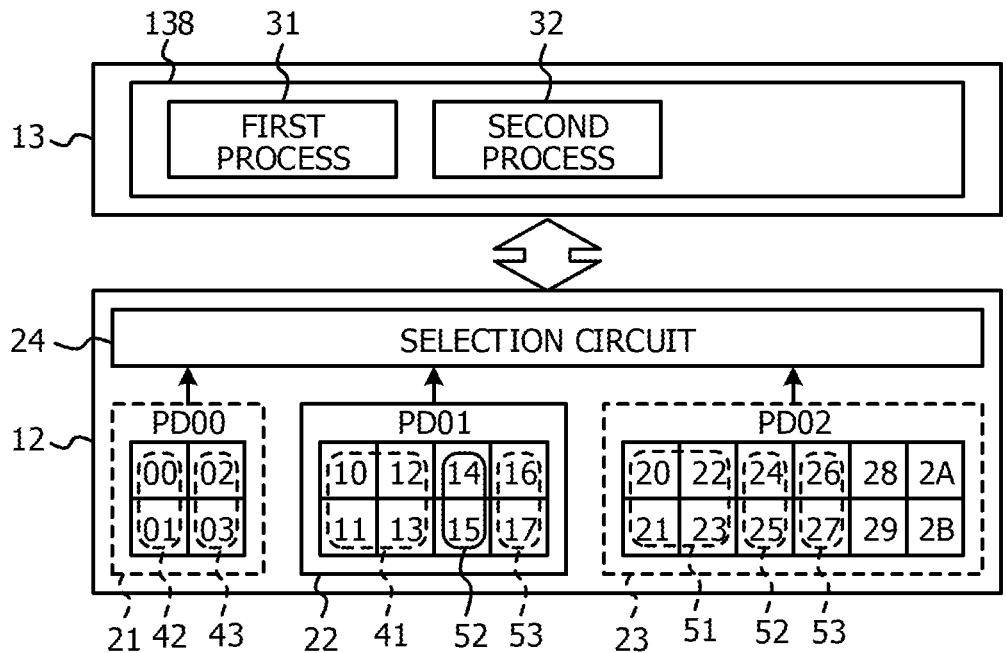
FIGS. 10A to 10D are diagrams illustrating examples of states of the dynamic reconfiguration accelerator and the calculation circuit.
Figure 10B:
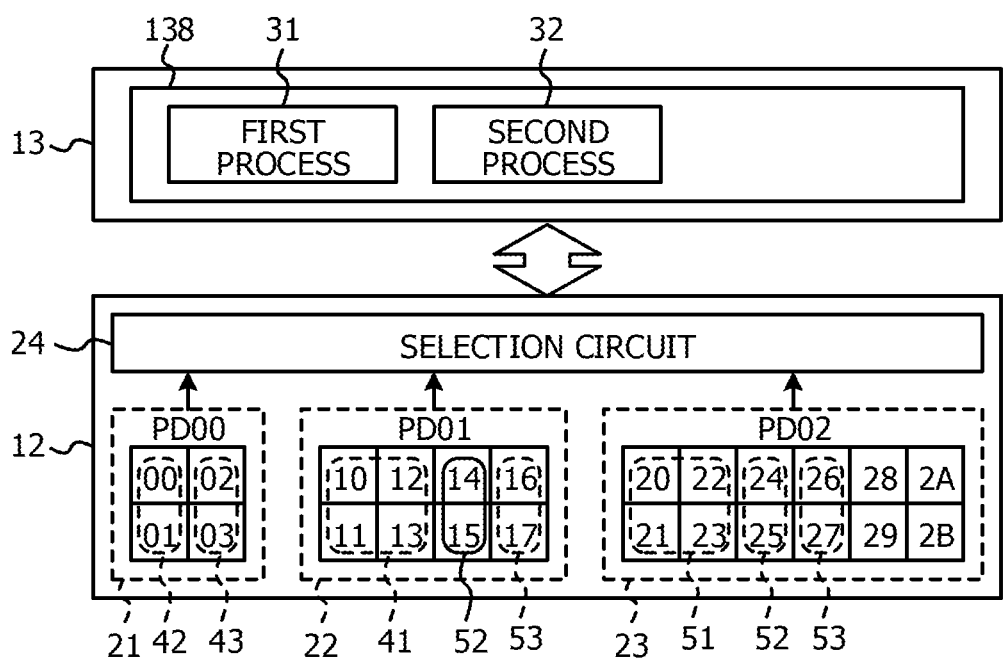
Figure 10C:
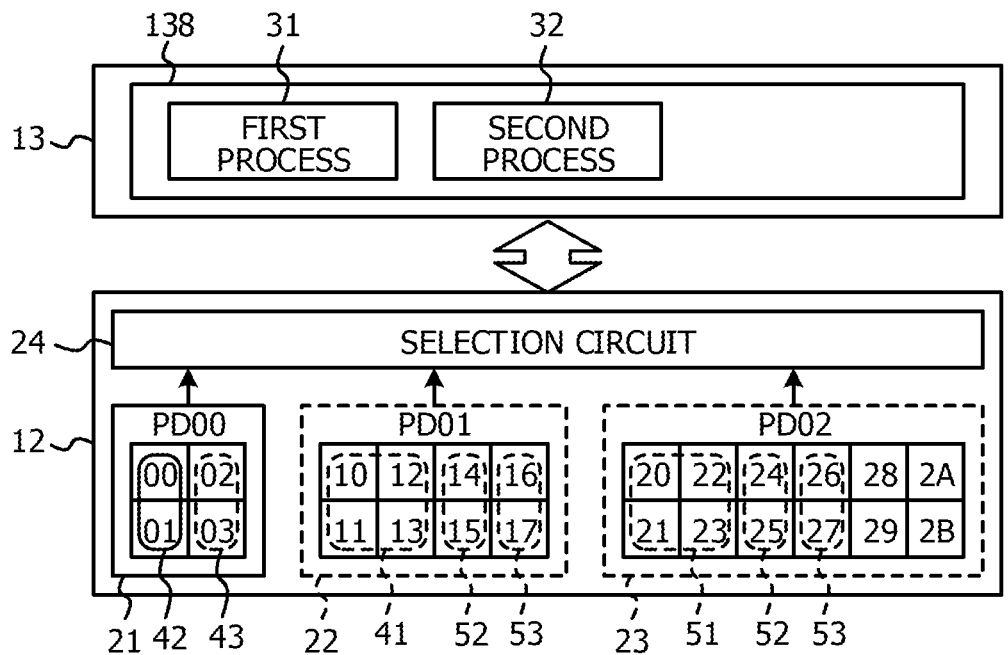
Figure 10D:
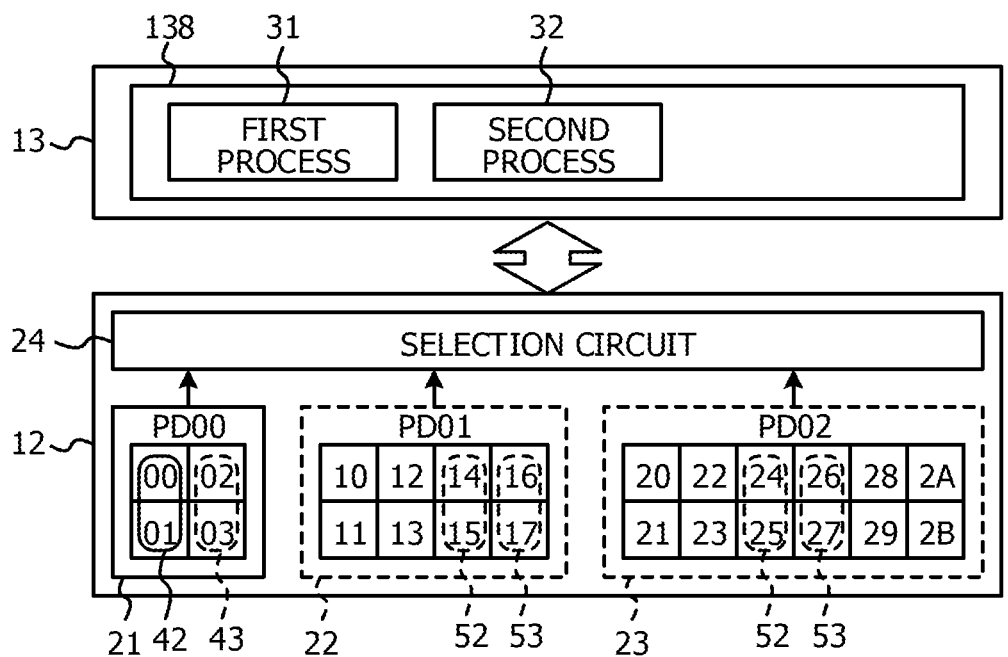
Figure 11:
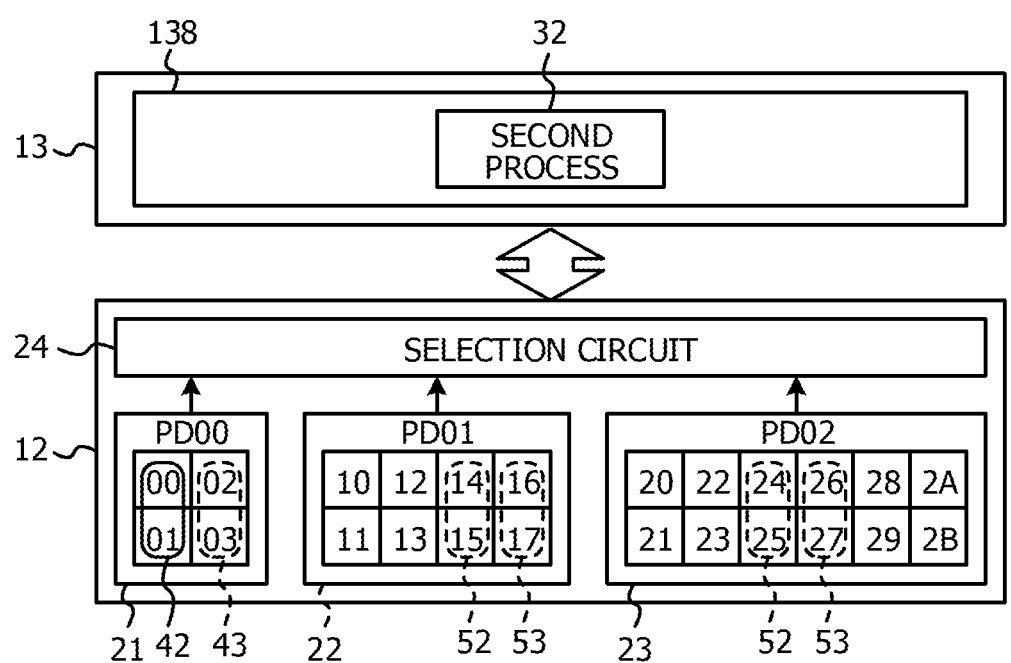
FIG. 11 is a diagram illustrating an example of states of the dynamic reconfiguration accelerator and the calculation circuit.

FIG. 2 is a diagram illustrating an example of a timing chart of the calculation processing. FIG. 3 is a diagram illustrating an example of the calculation processing. The calculation processing illustrated in FIGS. 2 and 3 may be executed by the calculation device 1 illustrated in FIG. 2. FIGS. 4A and 4B are diagrams illustrating an example of processing of S101. FIG. 5 is a diagram illustrating an example of processing of S103. FIG. 6 is a diagram illustrating an example of processing of S107. FIG. 7 is a diagram illustrating an example of processing of S108. The pieces of processing illustrated in FIGS. 4 to 7 may correspond to the processing illustrated in FIG. 3. FIGS. 8A to 8D illustrate examples of states of the dynamic reconfiguration accelerator and the calculation circuit. FIGS. 9A and 9B illustrate examples of states of the dynamic reconfiguration accelerator and the calculation circuit. FIGS. 10A to 10D illustrate examples of states of the dynamic reconfiguration accelerator and the calculation circuit. FIG. 11 illustrates an example of states of the dynamic reconfiguration accelerator and the calculation circuit. The dynamic reconfiguration accelerator and the calculation circuit in FIGS. 8A to 8D, 9A, 9B, 10A to 10D, and 11 may be the dynamic reconfiguration accelerator and the calculation circuit illustrated in FIG. 1. FIGS. 12A, 12B, 13A, 13B, 14A, 14B, 15A, and 15B illustrate examples of a management table in a state in which the calculation processing is executed.

Figure 8A:
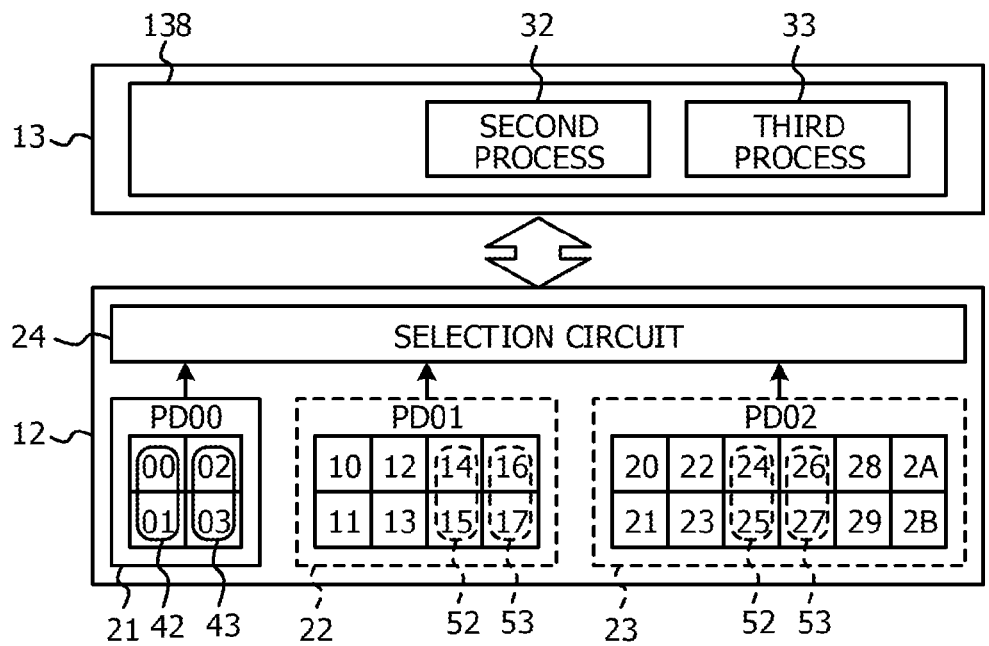
FIGS. 8A to 8D are diagrams illustrating examples of states of a dynamic reconfiguration accelerator and a calculation circuit.
Figure 8B:
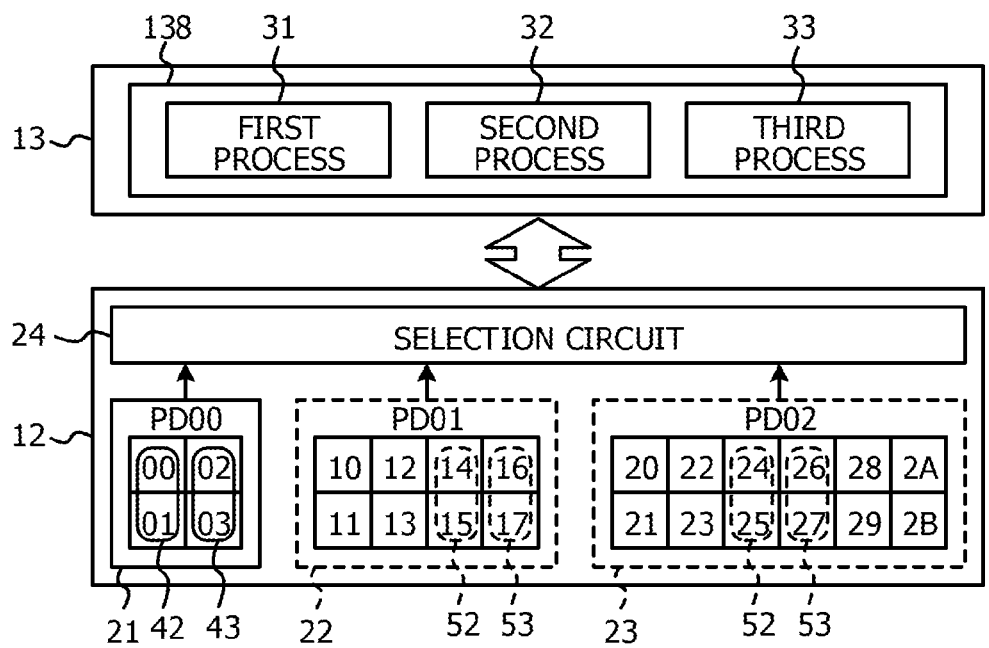
Figure 8C:
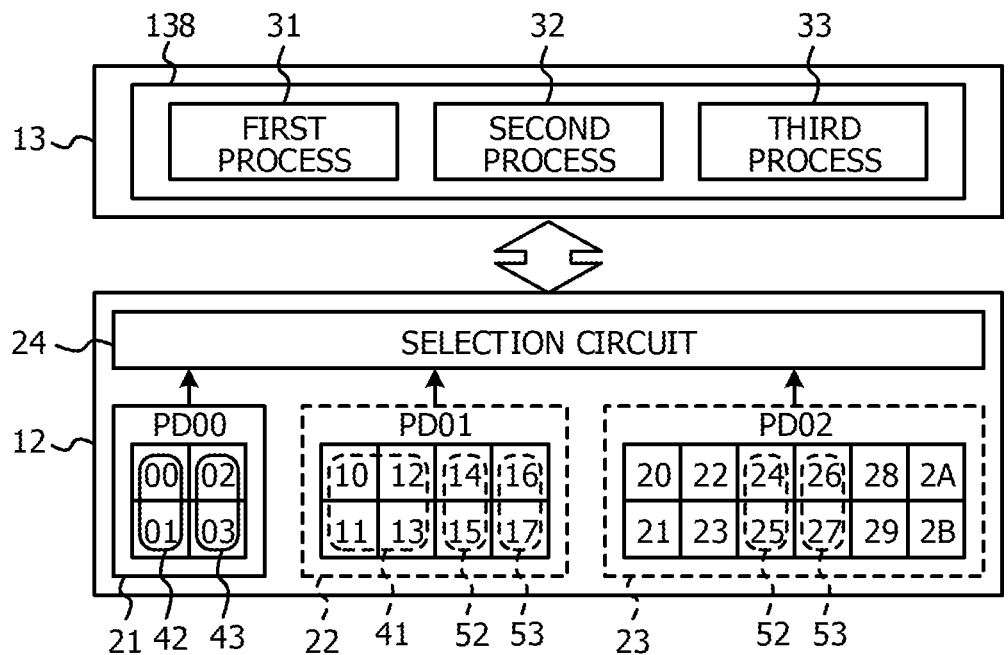
Figure 8D:
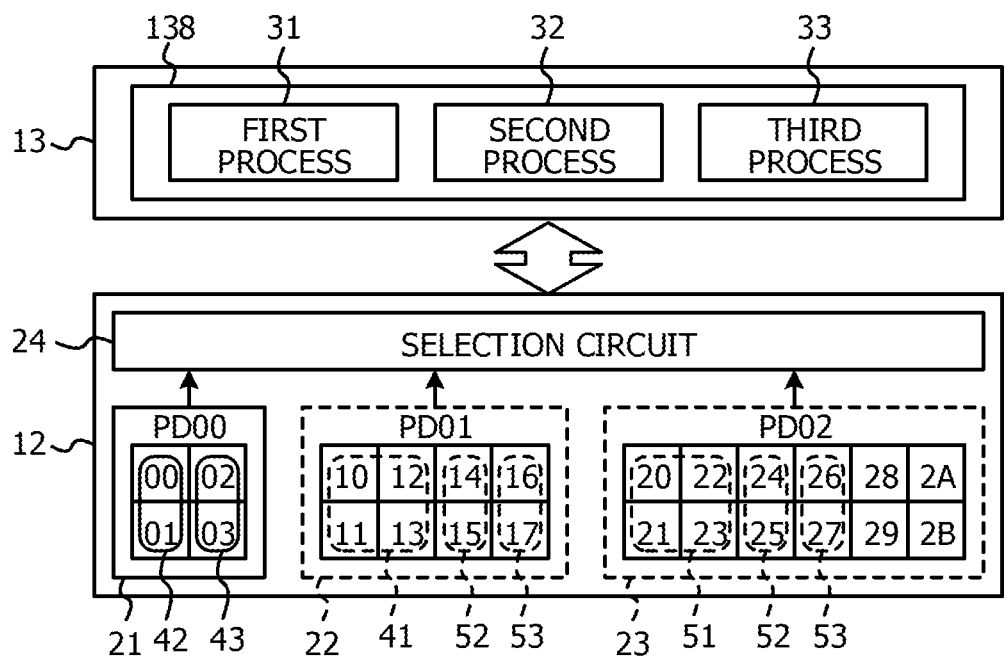

FIG. 8A illustrates a first state at a time t0 of FIG. 2, FIG. 8B illustrates a second state that follows the first state, FIG. 8C illustrates a third state that follows the second state, and FIG. 8D illustrates a fourth state that follows the third state. The second state illustrated in FIG. 8B to the fourth state illustrated in FIG. 8D correspond to the state at the time t1 of FIG. 2. FIG. 9A illustrates a fifth state that follows the fourth state, and FIG. 9B illustrates a sixth state that follows the fifth state. The fifth state illustrated in FIG. 9A corresponds to the state at the time t1 of FIG. 2, and the sixth state illustrated in FIG. 9B corresponds to the state at the time t2 of FIG. 2. FIG. 10A illustrates a seventh state that follows the sixth state, FIG. 10B illustrates an eight state that follows the seventh state, FIG. 10C illustrates a nine state that follows the eighth state, and FIG. 10D illustrates a tenth state that follows the ninth state. The seventh state illustrated in FIG. 10A, the eighth state illustrated in FIG. 10B, the ninth state illustrated in FIG. 10C, and the tenth state illustrated in FIG. 10D correspond to the state at the time t3 of FIG. 2. FIG. 11 illustrates an eleventh state that follows the tenth state and corresponds to the state at the time t4 of FIG. 2.

FIG. 12A illustrates the management table in the first state illustrated in FIG. 8A, and FIG. 12B illustrates the management table in the fourth state illustrated in FIG. 8D. FIG. 13A illustrates the management table in the fifth state illustrated in FIG. 9A, and FIG. 13B illustrates the management table in the sixth state illustrated in FIG. 9B. FIG. 14A illustrates the management table in the seventh state illustrated in FIG. 10A, and FIG. 14B illustrates the management table in the eighth state illustrated in FIG. 10B. FIG. 15A illustrates the management table in the ninth state illustrated in FIG. 10C, and FIG. 15B illustrates the management table in the tenth state illustrated in FIG. 10D.

In FIGS. 12 to 15, in an item of "circuit arrangement area," PD00 indicates the first circuit arrangement area 21, PD01 indicates the second circuit arrangement area 22, and PD02 indicates the third circuit arrangement area 23. An item of "ON/OFF" indicates whether power supply of a corresponding circuit arrangement area is turned on or off, and "1" indicates that power supply of the corresponding circuit arrangement area is turned on, and "0" indicates that the power supply of the corresponding circuit arrangement area is turned off. An item of "circuit resource" indicates any one of the eleventh circuit resource PR00 to the 3B circuit resource PR2B. An item of "arrangement" indicates whether a circuit is arranged in the corresponding circuit resource, and "1" indicates that a circuit is arranged in the corresponding circuit resource, and "0" indicates that a circuit is not arranged in the corresponding circuit resource. An item of "circuit ID" indicates identification display of a circuit arranged in the corresponding circuit resource, and "ID35" is identification display of a circuit that executes the first processing, and "ID21" is identification display of a circuit that executes the second processing, and "ID22" is identification display of a circuit that executes the third processing. An item of "main/sub" indicates whether the circuit arranged in the corresponding circuit resource is a main circuit or a sub circuit, and "1" indicates that the main circuit is arranged in the corresponding circuit resource, and "0" indicates that the sub circuit is arranged in the corresponding circuit resource. The main circuit is a circuit arranged in a minimum circuit arrangement area the circuit scale of which is the minimum from among circuits that execute substantially the same processing. The sub circuit is a circuit that executes substantially the same processing as the main circuit, and is arranged in a circuit arrangement area the circuit scale of which is the same as or larger than that of the minimum circuit arrangement area. An item of "in operation" indicates whether the circuit arranged in the corresponding circuit resource operates and is executing processing, and "1" indicates that the circuit operates and is executing processing, and "0" indicates that the circuit does not operate and is not executing processing.

In accordance with the calculation processing of the timing chart illustrated in FIG. 2, the calculation processing of the calculation device 1 is described with reference to FIGS. 2 to 15. The calculation device 1 performs dynamic reconfiguration of circuits that respectively correspond to the first processing, the second processing, and the third processing into the dynamic reconfiguration accelerator 12 and the first processing, the second processing, and the third processing are respectively executed by the circuits on which dynamic reconfiguration into the dynamic reconfiguration accelerator 12 has been performed.

In the timing chart illustrated in FIG. 2, the calculation device 1 executes the second processing and the third processing before executing the first processing (time t0). The calculation device 1 starts to execute the first processing when the second processing and the third processing are being executed (time t1). The calculation device 1 ends the execution of the third processing (time t2). After that, the calculation device 1 ends the execution of the first processing (time t3). The calculation device 1 executes the second processing after having ended the execution of the first processing (time t4).

As illustrated in FIG. 8A, when the calculation device 1 is executing the second processing and the third processing at the time t0, the processing execution unit 138 of the calculation circuit 13 includes a second processing command 32 and a third processing command 33. The second processing command 32 is a command used to instruct the dynamic reconfiguration accelerator 12 to execute the second processing, and the third processing command 33 is a command used to instruct the dynamic reconfiguration accelerator 12 to execute the third processing. To the first circuit arrangement area 21 indicated by the solid line in FIG. 8A, power supply voltage is supplied from the power supply voltage supply circuit 14. To the second circuit arrangement area 22 and the third circuit arrangement area 23 indicated by the broken line in FIG. 8A, power supply voltage is not supplied from the power supply voltage supply circuit 14. For example, a term "power supply voltage is not supplied" or "power is turned off" correspond to power gating in which leakage power is reduced to zero by blocking the power supply and back gate bias control in which leakage is reduced by increasing threshold value voltage. For example, a term such as "power supply voltage is supplied" or "power is turned on" indicates a state in which a circuit arrangement area is caused to be allowed to operate by the power gating or the back gate bias control. In addition, the term "power supply voltage is not supplied" or "power supply is turned off" indicates that power supply voltage control is performed in which leakage power is reduced when the operation stops by the power gating or the back gate bias control. When "power supply is turned off" by the back gate bias control, the state proceeds to a low electric power state without deletion of configuration information. At the time t0, a second main circuit 42 and a third main circuit 43 are arranged in the first circuit arrangement area 21 of the dynamic reconfiguration accelerator 12, and a second sub circuit 52 and a third sub circuit 53 are arranged in each of the second circuit arrangement area 22 and the third circuit arrangement area 23. Each of the second main circuit 42 and the second sub circuit 52 has a circuit scale arranged in a two circuit resources portion, and each of the third main circuit 43 and the third sub circuit 53 has a circuit scale arranged in a two circuit resources portion. The second main circuit 42 and the third main circuit 43 each of which is indicated by the solid line are respectively executing the second processing and the third processing, and the second sub circuit 52 and the third sub circuit 53 each of which is indicated by the broken line are stopping the processing. The selection circuit 24 outputs information that has been output from the second main circuit 42 and the third main circuit 43 arranged in the first circuit arrangement area 21, to the calculation circuit 13.

At the time t1, as illustrated in FIG. 8B, for example, when a first processing command 31 is transmitted from a host device, the calculation circuit 13 arranges a first main circuit and a first sub circuit that execute the first processing, in the dynamic reconfiguration accelerator 12 (S101). For example, the main circuit arrangement unit 130 reads first configuration information used for reconfiguration of the circuit that executes the first processing from the configuration information 111 (S201). The main circuit arrangement unit 130 obtains circuit scale information indicating the circuit scale of the circuit that executes the first processing from the first configuration information (S202). The circuit that executes the first processing has a circuit scale arranged in a four circuit resources portion. The main circuit arrangement unit 130 initializes a circuit arrangement area number n at "0" (S203). The circuit arrangement area number n is assigned in order of the smallest circuit scale. The circuit arrangement area number n of the first circuit arrangement area 21 including four circuit resources is "1", and the circuit arrangement area number n of the second circuit arrangement area 22 including eight circuit resources is "2". The circuit arrangement area number n of the third circuit arrangement area 23 including 12 circuit resources is "3". The main circuit arrangement unit 130 increments the circuit arrangement area number n (S204), and checks the number of available circuit resources in the first circuit arrangement area 21 the circuit arrangement area number n of which is "1" (S205). The first circuit arrangement area 21 includes the four circuit resources such as the eleventh circuit resource PR00 to the fourteenth circuit resource PR03, but the second main circuit 42 and the third main circuit 43 are arranged in the first circuit arrangement area 21, so that the number of available circuit resources in the first circuit arrangement area 21 is "0".

The main circuit arrangement unit 130 determines whether the first main circuit that executes the first processing is allowed to be arranged in the first circuit arrangement area 21 (S206). The number of available circuit resources of the first circuit arrangement area 21 is "0", and the first main circuit having the circuit scale arranged in a four circuit resources portion is not allowed to be arranged in the first circuit arrangement area 21, so that the processing proceeds to S208. In S208, the main circuit arrangement unit 130 determines whether the first main circuit is allowed to be arranged in the first circuit arrangement area 21 when a sub circuit of processing other than the first processing is deleted. In the case in which the main circuit arrangement unit 130 determines that the first main circuit is allowed to be arranged in the first circuit arrangement area 21 when the sub circuit of the processing other than the first processing is deleted, the main circuit arrangement unit 130 deletes the sub circuit of the further processing and arranges the first main circuit in the first circuit arrangement area 21 (S209). However, the sub circuit is not arranged in the first circuit arrangement area 21, so that the main circuit arrangement unit 130 determines whether check processing has been executed for all of the first circuit arrangement area 21 to the third circuit arrangement area 23 (S210). The main circuit arrangement unit 130 does not check the second circuit arrangement area 22 and the third circuit arrangement area 23 (S210), so that the main circuit arrangement unit 130 increments the circuit arrangement area number n to "2" (S204).

The main circuit arrangement unit 130 checks that the number of available circuit resources of the second circuit arrangement area 22 the circuit arrangement area number n of which is "2" is "4" (S205), and determines that the first main circuit is allowed to be arranged in the second circuit arrangement area 22 (S206). After that, as illustrated in FIG. 8C, the main circuit arrangement unit 130 arranges a first main circuit 41 in the second circuit arrangement area 22 (S207). For example, when the first main circuit is not arranged in the processing of S204 to S208 for the first circuit arrangement area 21 to the third circuit arrangement area 23 (S210), the main circuit arrangement unit 130 performs output of a main circuit arrangement disable signal indicating that arrangement of the first main circuit is not performed (S211).

The sub circuit arrangement unit 131 increments the circuit arrangement area number n (S212) and checks the number of available circuit resources of the third circuit arrangement area 23 the circuit arrangement area number n of which is "3" (S213). The third circuit arrangement area 23 includes the 12 circuit resources such as the 31th circuit resource PR20 to the 3B circuit resource PR2B, but the second sub circuit 52 and the third sub circuit 53 are arranged in the third circuit arrangement area 23, so that the number of available circuit resources of the third circuit arrangement area 23 is "8". The sub circuit arrangement unit 131 determines that the number of available circuit resources of the third circuit arrangement area 23 is "8", and a first sub circuit having the circuit scale arranged in the four circuit resources portion is allowed to be arranged in the third circuit arrangement area 23 (S214). As illustrated in FIG. 8D, the sub circuit arrangement unit 131 arranges a first sub circuit 51 in the third circuit arrangement area 23 (S215). After that, the sub circuit arrangement unit 131 determines that all circuit arrangement areas have been checked (S216), and the selection circuit arrangement unit 137 performs arrangement of the selection circuit 24 (S217). The management table update unit 139 updates the management table 112 from the state illustrated in FIG. 12A to the state illustrated in FIG. 12B (S218). The management table 112 is updated so that it is indicated that the first main circuit 41 indicated by ID35 is arranged in the second circuit arrangement area 22 indicated by PD01. The management table 112 is updated so that it is indicated that the first sub circuit 51 indicated by ID35 is arranged in the second circuit arrangement area 22 indicated by PD01.

The arrangement of the circuit that executes the first processing has been performed (S102), so that the calculation circuit 13 starts the circuit that executes the first processing (S103). More specifically, the arrangement area determination unit 132 determines whether the circuit that executes the first processing has been arranged in the first circuit arrangement area 21 to the third circuit arrangement area 23 and weather power supply voltage is supplied from the power supply voltage supply circuit 14 to the first circuit arrangement area 21 to the third circuit arrangement area 23 (S301). For example, the arrangement area determination unit 132 executes the processing of S301, with reference to the management table 112. As illustrated in FIG. 8D, the first main circuit 41 and the first sub circuit 51 that execute the first processing 41 are not arranged in the first circuit arrangement area 21, but power supply voltage is supplied from the power supply voltage supply circuit 14 to the first circuit arrangement area 21 as indicated by the solid line. The first main circuit that executes the first processing 41 is arranged in the second circuit arrangement area 22, but power supply voltage is not supplied from the power supply voltage supply circuit 14 to the second circuit arrangement area 22 as indicated by the broken line. The first sub circuit 51 that executes the first processing is arranged in the third circuit arrangement area 23, but power supply voltage is not supplied from the power supply voltage supply circuit 14 to the third circuit arrangement area 23 as indicated by the broken line. After that, the arrangement area determination unit 132 determines that there is no circuit arrangement area in which the first main circuit 41 or the first sub circuit 51 that executes the first processing is arranged and to which power supply voltage is supplied from the power supply voltage supply circuit 14 (S302).

The minimum circuit arrangement area determination unit 133 determines the second circuit arrangement area 22 having the smallest circuit scale from among the circuit arrangement areas in each of which the circuit that executes the first processing is arranged, to be a first minimum circuit arrangement area (S303). The minimum circuit arrangement area determination unit 133 checks whether the circuit that has been arranged in the first circuit arrangement area 21 the circuit scale of which is smaller than that of the second circuit arrangement area 22 that is the first minimum circuit arrangement area is arranged in the second circuit arrangement area 22 (S304). The second sub circuit 52 and the third sub circuit 53 having the configurations that respectively correspond to those of the second main circuit 42 and the third main circuit 43 that have been arranged in the first circuit arrangement area 21 are arranged in the second circuit arrangement area 22. The minimum circuit arrangement area determination unit 133 determines that the second processing and the third processing that have been processed in the first circuit arrangement area 21 are allowed to be executed in the second circuit arrangement area 22 (S305). The minimum circuit arrangement area determination unit 133 generates execution area change instruction information used to change the second processing and the third processing to be executed in the second circuit arrangement area 22 (S306).

The power supply control unit 134 issues a power supply voltage control command that has been generated based on the execution area change instruction information, and outputs the power supply voltage control command to the power supply voltage supply circuit 14 (S307). The power supply voltage control command includes a command indicating that power supply voltage is supplied to the second circuit arrangement area 22 and power supply voltage is not supplied to the first circuit arrangement area 21 and the third circuit arrangement area 23. The power supply voltage supply circuit 14 supplies power supply voltage in accordance with the power supply voltage control command, to the dynamic reconfiguration accelerator 12. As illustrated in FIG. 9A, power supply voltage is supplied from the power supply voltage supply circuit 14 to the second circuit arrangement area 22 indicated by the solid line, and power supply voltage is not supplied from the power supply voltage supply circuit 14 to the first circuit arrangement area 21 and the third circuit arrangement area 23 indicated by the broken line. The power supply control unit 134 controls the selection circuit 24 so that information that has been output from the second circuit arrangement area 22 is output from the calculation circuit 13 (S308). The management table update unit 139 updates the management table 112 from the state illustrated in FIG. 12B to the state illustrated in FIG. 13A (S309). The management table 112 is updated so that it is indicated that the power supply of the first circuit arrangement area 21 indicated by PD00 is turned off and the power supply of the second circuit arrangement area 22 indicated by PD01 is turned on. The management table 112 is updated so that it is indicated that the second main circuit 42 and the third main circuit 43 that are respectively indicated by ID21 and ID22 and arranged in the first circuit arrangement area 21 indicated by PD00 are not in operation. The management table 112 is updated so that it is indicated that the first main circuit 41, the second sub circuit 52, and the third sub circuit 53 that are respectively indicated by ID35, ID21, and ID22 and arranged in the second circuit arrangement area 22 indicated by PD01 are in operation. The processing execution unit 138 executes the first processing through the first main circuit 41 (S310).

The calculation circuit 13 sequentially executes the processing in which whether processing other than the first processing is executed is determined (S104), the processing in which whether the processing other than the first processing ends is determined (S106), and the processing in which whether the first processing ends is determined (S108). When it is determined that the processing other than the first processing is executed, the processing other than the first processing is started up in the processing of S301 to S310 (S105).

At the time t2, for example, when a third processing end command is transmitted from the host device, the calculation circuit 13 determines that the third processing ends (S106), and stops the circuit of the third processing (S107). For example, the execution processing determination unit 136 checks processing that is being executed in the second circuit arrangement area 22 in which the third sub circuit 53 that is executing the third processing to be stopped is arranged (S401). The execution processing determination unit 136 checks that the three pieces of processing such as the first processing, the second processing, and the third processing are being executed in the second circuit arrangement area 22. After that, the management table update unit 139 updates the management table 112 from the state illustrated in FIG. 13A to the state illustrated in FIG. 13B (S402). The management table 112 is updated so that it is indicated that the third sub circuit 53 that is indicated by ID22 and arranged in the second circuit arrangement area 22 indicated by PD01 is not in operation. After that, the execution processing determination unit 136 determines that the third processing is executed not in the third main circuit 43 that has been arranged in the first circuit arrangement area 21, but the third sub circuit 53 that has been arranged in the second circuit arrangement area 22 (S403). As illustrated in FIG. 9B, the processing execution unit 138 ends the third processing (S404).

When the processing execution unit 138 ends the third processing, the calculation circuit 13 determines that a series of pieces of processing corresponding to the third processing end command has ended, and deletes the third processing command 33 from the processing execution unit 138.

At the time t3, for example, when a first processing end command is transmitted from the host device, the calculation circuit 13 determines that the first processing ends (S108), and stops the circuit of the first processing (S109). For example, the execution processing determination unit 136 checks processing that is being executed in the second circuit arrangement area 22 in which the first main circuit 41 that is executing the first processing to be stopped has been arranged (S401). The execution processing determination unit 136 checks that the two processing such as the first processing and the second processing are being executed in the second circuit arrangement area 22. The management table update unit 139 updates the management table 112 from the state illustrated in FIG. 13B to the state illustrated in FIG. 14A (S402). The management table 112 is updated so that it is indicated that the first main circuit 41 that is indicated by ID35 and arranged in the second circuit arrangement area 22 indicated by PD01 is not in operation. After the execution processing determination unit 136 has determined that the first processing has been executed by the first main circuit 41 arranged in the second circuit arrangement area 22 (S403), the execution processing determination unit 136 determines that the processing other than the first processing is not executed by the main circuit in the second circuit arrangement area 22 (S405). When the execution processing determination unit 136 has determined that the processing other than the first processing is not executed by the main circuit in the second circuit arrangement area 22 (S405), the execution processing determination unit 136 determines stop of the second circuit arrangement area 22 (S406). The management table update unit 139 updates the management table 112 from the state illustrated in FIG. 14A to the state illustrated in FIG. 14B (S407). The management table 112 is updated so that it is indicated that the power supply of the second circuit arrangement area 22 indicated by PD01 is turned off.

The calculation circuit 13 starts up the circuit that executes the second processing (S408). For example, the arrangement area determination unit 132 determines whether the circuit that executes the second processing is arranged in the first circuit arrangement area 21 to the third circuit arrangement area 23, and whether power supply voltage is supplied from the power supply voltage supply circuit 14 to the first circuit arrangement area 21 to the third circuit arrangement area 23 (S301). As illustrated in FIG. 14A, the second main circuit 42 is arranged in the first circuit arrangement area 21, and the second sub circuit 52 is arranged in the second circuit arrangement area 22 and the third circuit arrangement area 23. Power supply voltage is not supplied to the first circuit arrangement area 21 to the third circuit arrangement area 23 from the power supply voltage supply circuit 14. After that, the arrangement area determination unit 132 determines that there is no circuit arrangement area in which the circuit that executes the second processing is arranged and to which power supply voltage is supplied from the power supply voltage supply circuit 14 (S302).

The minimum circuit arrangement area determination unit 133 determines the first circuit arrangement area 21 having the smallest circuit scale from among the circuit arrangement areas in each of which the circuit that executes the second processing, to be a second minimum circuit arrangement area (S303). After that, the minimum circuit arrangement area determination unit 133 checks that there is no circuit arrangement area having the smaller circuit scale than that of the second circuit arrangement area 22 that is the second minimum circuit arrangement area (S304), and determines that there is no another processing that is allowed to be executed in the first circuit arrangement area 21 (S305).

The power supply control unit 134 issues a power supply voltage control command indicating that power supply voltage is supplied to the first circuit arrangement area 21, and outputs the power supply voltage control command to the power supply voltage supply circuit 14 (S307). The power supply control unit 134 controls the selection circuit 24 so that the information that has been output from the first circuit arrangement area 21 is output to the calculation circuit 13 (S308). The management table update unit 139 updates the management table 112 from the state illustrated in FIG. 14B to the state illustrated in FIG. 15A (S309). The management table 112 is updated so that it is indicated that power supply voltage is supplied to the first circuit arrangement area 21 indicated by PD00 and the second main circuit 42 that is indicated by ID21 and arranged in the first circuit arrangement area 21 is in operation. The management table 112 is updated so that it is indicated that the second sub circuit 52 that is indicated by ID21 and arranged in the second circuit arrangement area 22 indicated by PD01 is not in operation. In addition, as illustrated in FIG. 10C, the processing execution unit 138 executes the second processing through the second main circuit 42 (S310).

The processing execution unit 138 ends the first processing (S409), and the power supply control unit 134 issues a power supply voltage control command indicating that power supply voltage is not supplied to the second circuit arrangement area 22, and outputs the power supply voltage control command to the power supply voltage supply circuit 14 (S410).

The calculation circuit 13 deletes the first main circuit 41 and the first sub circuit 51 that execute the first processing from the dynamic reconfiguration accelerator 12 (S110). For example, as illustrated in FIG. 10D, the main circuit arrangement unit 130 deletes the first main circuit 41 from the second circuit arrangement area 22, and the sub circuit arrangement unit 131 deletes the first sub circuit 51 from the third circuit arrangement area 23 (S501). The management table update unit 139 updates the management table 112 from the state illustrated in FIG. 15A to the state illustrated in FIG. 15B (S501). In the management table 112, the first main circuit 41 indicated by ID35 is deleted from the second circuit arrangement area 22 indicated by PD01, and the first sub circuit 51 indicated by ID35 is deleted from the third circuit arrangement area 23 indicated by PD02.

When the first main circuit 41 and the first sub circuit 51 that execute the first processing are deleted from the dynamic reconfiguration accelerator 12, the calculation circuit 13 determines that a series of pieces of processing corresponding to the first processing end command has ended, and deletes the first processing command 31 from the processing execution unit 138.

The calculation device switches the main circuit and the sub circuit depending on processing because each of the main circuit and sub circuit that execute substantially the same processing is arranged in the circuit arrangement area with a circuit that executes another processing. Static power consumption caused by leakage current or the like that tends to increase with miniaturization of a PLD may be reduced because the calculation device switches the main circuit and the sub circuit depending on processing.

Figure 16:
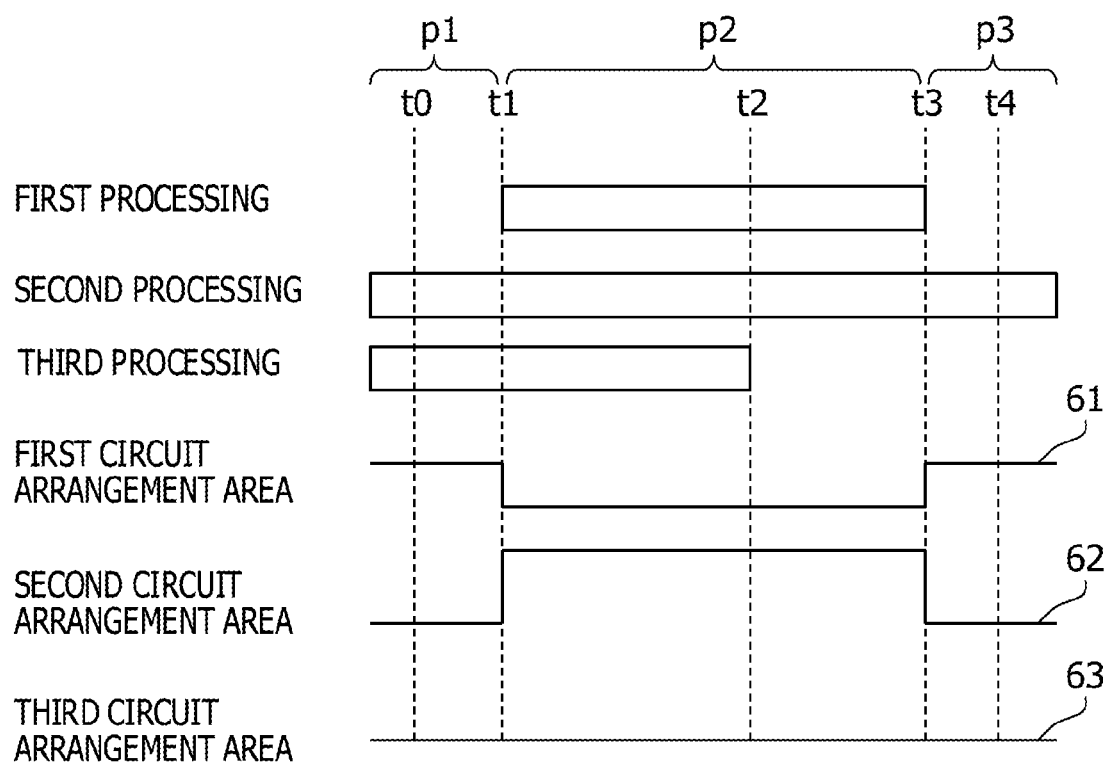
FIG. 16 is a diagram illustrating an example of pieces of leakage current of circuit arrangement areas when the calculation device operates.

FIG. 16 is a diagram illustrating an example of leakage current of a circuit arrangement area when the calculation device operates. In FIG. 16, leakage current of a circuit arrangement area when the calculation device 1 operates in accordance with the timing chart illustrated in FIG. 2 is illustrated. In FIG. 16, a waveform 61 indicates leakage current of the first circuit arrangement area 21, a waveform 62 indicates leakage current of the second circuit arrangement area 22, and a waveform 63 indicates leakage current of the third circuit arrangement area 23.

In a time period p1 including the time t0, the calculation device 1 turns on the power supply of the first circuit arrangement area 21, executes the second processing and the third processing in the first circuit arrangement area 21, and turns off the power supply of the second circuit arrangement area 22 and the third circuit arrangement area 23. In the time period p1, the power supply of the second circuit arrangement area 22 and the third circuit arrangement area 23 having relatively large circuit scales are turned off, so that the leakage current is reduced.

When the calculation device 1 starts to execute the first processing at the time t1, the calculation device 1 changes the second processing and the third processing that have been executed in the first circuit arrangement area 21 to be executed in the second circuit arrangement area 22 in order to reduce leakage current by executing all of the pieces of processing in a single circuit arrangement area. In the time period p2 including the time t2, the calculation device 1 turns on the power supply of the second circuit arrangement area 22, executes the first processing, the second processing, and the third processing in the second circuit arrangement area 22, and turns off the power supply of the first circuit arrangement area 21 and the third circuit arrangement area 23. In the time period p2, the power supply of the first circuit arrangement area 21 and the third circuit arrangement area 23 are turned off, so that leakage current of the second circuit arrangement area 22 flows, but leakage current of the first circuit arrangement area 21 and the third circuit arrangement area 23 does not flow, so that the leakage current is suppressed.

When the calculation device 1 ends the execution of the first processing at the time t3, the calculation device 1 changes the second processing executed in the second circuit arrangement area 22 to be executed in the first circuit arrangement area 21 having the small circuit scale and having relatively-small leakage current. In the time period p3 including the time t4, the calculation device 1 turns on the power supply of the first circuit arrangement area 21, executes the second processing in the first circuit arrangement area 21, and turns off the power supply of the second circuit arrangement area 22 and the third circuit arrangement area 23. In the time period p3, the power supply of the second circuit arrangement area 22 and the third circuit arrangement area 23 each having the relatively-large circuit scale are turned off, so that the leakage current is reduced.

FIG. 17 is a diagram illustrating an example of comparison of pieces of leakage current. In FIG. 17, comparison of leakage current when a circuit is arranged by the above-described circuit arrangement method with leakage current when a circuit is arranged by another circuit arrangement method is illustrated. In FIG. 17, the horizontal axis indicates an overlap ratio of a processing period of processing A and a processing period of processing B different from the processing A, and the vertical axis indicates leakage current. In FIG. 17, the solid line indicates leakage current when the arrangement of the circuit is performed by the above-described circuit arrangement method, and the broken line indicates leakage current when the arrangement of the circuit is performed by individual arrangement, and the dashed line indicates leakage current when the arrangement of the circuit is performed by collective arrangement. In the individual arrangement, the circuit that executes the processing A is arranged in the first circuit arrangement area having the relatively-small area and having small leakage current, and the circuit that executes the processing B is arranged in the second circuit arrangement area having the relatively-large area and having large leakage current. In the collective arrangement, both of the circuit that executes the processing A and the circuit that executes the processing B are arranged in the second circuit arrangement area having the relatively-large area and having large leakage current.

In the individual arrangement, the circuit that executes the processing A and the circuit that executes the processing B are arranged in different circuit arrangement areas, so that leakage current is fixed at "P1+P2" regardless of timing at which the processing A and the processing B are processed. In the collective arrangement, as an overlap ratio of the processing period of the processing A and the processing period of the processing B becomes larger, leakage current per a unit of times becomes smaller, and as the overlap ratio of the processing period of the processing A and the processing period of the processing B becomes smaller, leakage current per a unit of times becomes larger.

In the above-described circuit arrangement method, when the overlap of the processing period of the processing A and the processing period of the processing B is relatively small, the leakage current is fixed at "P1+P2" similar to the individual arrangement. In addition, when the overlap ratio of the processing period of the processing A and the processing period of the processing B is relatively large, the leakage current per a unit of times may be reduced similar to the collective arrangement.

The calculation device 1 includes the dynamic reconfiguration accelerator 12 including three areas to which different pieces of power supply voltage are supplied such as the first circuit arrangement area 21 to the third circuit arrangement area 23. For example, the calculation device may include a dynamic reconfiguration accelerator including two or four or more circuit arrangement areas to which different pieces of power supply voltage are supplied. The circuit scales of these circuit arrangement areas may be different, and the circuit arrangement areas having the same circuit scale may be included in the dynamic reconfiguration accelerator 12.

In the calculation device 1, the arrangement of the main circuit and the sub circuit that execute target processing may be performed by the processing illustrated in FIGS. 4A and 4B, and at least two circuits that execute the same processing may be arranged in different circuit arrangement areas. When the main circuit and the sub circuit are arranged by the processing illustrated in FIGS. 4A and 4B, the sub circuit may be arranged in a circuit arrangement area having a circuit scale that is the same as or larger than that of the circuit arrangement area in which the main circuit is arranged. For example, when the arrangement of the main circuit and the sub circuit is performed by processing different from the processing illustrated in FIGS. 4A and 4B, the sub circuit may be arranged in a circuit arrangement area having a circuit scale that is smaller than that of the circuit arrangement area in which the main circuit is arranged.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A calculation device comprising:
    a programmable logic device including a plurality of circuit arrangement areas each to which power supply voltage allowed to be independently controlled is supplied; and
    a calculation circuit coupled to the programmable logic device,
    wherein the calculation circuit:
        arranges a main circuit that executes specific processing in a first circuit arrangement area included in the plurality of circuit arrangement areas; acquires a second circuit arrangement area in which a sub circuit that executes the specific processing is allowed to be arranged, included in the plurality of circuit arrangement areas and in which the main circuit is not arranged;
        arranges the sub circuit in the second circuit arrangement area; and
        causes one of the main circuit and the sub circuit to execute the specific processing.

2. The calculation device according to claim 1, wherein the calculation circuit determines a minimum circuit arrangement area having a smallest circuit scale from among circuit arrangement areas in which the main circuit and the sub circuit are arranged, and causes the main circuit or the sub circuit arranged in the minimum circuit arrangement area to execute the specific processing.

3. The calculation device according to claim 1, wherein the calculation circuit arranges the sub circuit in a circuit arrangement area, as the second circuit arrangement area, having a circuit scale that is identical to or larger than a circuit scale of the first circuit arrangement area.

4. The calculation device according to claim 3, wherein at an end of the specific processing, when the calculation circuit determines that the specific processing is executed in the sub circuit, the calculation circuit does not turn off a power supply of the second circuit arrangement area.

5. The calculation device according to claim 4, wherein at the end of the specific processing, when the calculation circuit determines that the specific processing is executed in the main circuit and a further main circuit that executes processing other than the specific processing is arranged in the second circuit arrangement area, the calculation circuit does not turn off a power supply of the first circuit arrangement area.

6. The calculation device according to claim 5, wherein at the end of the specific processing, when the calculation circuit determines that the specific processing is executed in the main circuit and the further main circuit that executes the processing other than the specific processing is not arranged in the first circuit arrangement area, the calculation circuit turns off the power supply of the first circuit arrangement area.

7. A calculation method, comprising:
    arranging, by a calculation circuit coupled to a programmable logic device, a main circuit that executes specific processing in a first circuit arrangement area included in a plurality of circuit arrangement areas of the programmable logic device, the plurality of circuit arrangement areas each to which power supply voltage allowed to be independently controlled being supplied;
    acquiring a second circuit arrangement area in which a sub circuit that executes the specific processing is allowed to be arranged, included in the plurality of circuit arrangement areas and in which the main circuit is not arranged;
    arranging the sub circuit in the second circuit arrangement area; and
    causing one of the main circuit and the sub circuit to execute the specific processing.

8. The calculation method according to claim 7, wherein in a minimum circuit arrangement area having a smallest circuit scale is determined from among circuit arrangement areas in which the main circuit and the sub circuit are arranged, and the main circuit or the sub circuit arranged in the minimum circuit arrangement area are caused to execute the specific processing.

9. The calculation method according to claim 7, wherein the sub circuit is arranged in a circuit arrangement area, as the second circuit arrangement area, having a circuit scale that is identical to or larger than a circuit scale of the first circuit arrangement area.

10. The calculation method according to claim 9, wherein at an end of the specific processing, when determining that the specific processing is executed in the sub circuit, a power supply of the second circuit arrangement area is not turned off.

11. The calculation method according to claim 10, wherein at the end of the specific processing, when determining that the specific processing is executed in the main circuit and a further main circuit that executes processing other than the specific processing is arranged in the second circuit arrangement area, a power supply of the first circuit arrangement area is not turned off.

12. The calculation method according to claim 11, wherein at the end of the specific processing, when determining that the specific processing is executed in the main circuit and the further main circuit that executes the processing other than the specific processing is not arranged in the first circuit arrangement area, the power supply of the first circuit arrangement area is turned off.

* * * * *